United States Patent [19]
Yajima

[11] Patent Number: 5,809,176
[45] Date of Patent: Sep. 15, 1998

[54] IMAGE DATA ENCODER/DECODER SYSTEM WHICH DIVIDES UNCOMPRESED IMAGE DATA INTO A PLURALITY OF STREAMS AND METHOD THEREOF

[75] Inventor: Akihiko Yajima, Suwa, Japan

[73] Assignee: Seiko Epson Corporation, Tokyo, Japan

[21] Appl. No.: 544,945

[22] Filed: Oct. 18, 1995

[30] Foreign Application Priority Data

Oct. 18, 1994 [JP] Japan .................................. 6-278500

[51] Int. Cl.⁶ ...................................................... G06K 9/36
[52] U.S. Cl. .......................................... 382/247; 382/233
[58] Field of Search .................................. 382/247, 233, 382/244; 341/51, 107

[56] References Cited

U.S. PATENT DOCUMENTS

| | | | |
|---|---|---|---|
| 4,652,856 | 3/1987 | Mohiuddin et al. | 341/60 |
| 4,891,643 | 1/1990 | Mitchell et al. | 358/426 |
| 4,905,297 | 2/1990 | Langdon, Jr. et al. | 382/247 |
| 5,138,447 | 8/1992 | Shen et al. | 348/409 |
| 5,406,282 | 4/1995 | Nomizu | 341/65 |
| 5,583,500 | 12/1996 | Allen et al. | 341/107 |

FOREIGN PATENT DOCUMENTS

| | | |
|---|---|---|
| SHO 62-185413 | 8/1987 | Japan . |
| SHO 63-74324 | 4/1988 | Japan . |
| SHO 63-76525 | 4/1988 | Japan . |

OTHER PUBLICATIONS

Howard et al., "Parallel Lossless Image compression Using Huffman and Arithmetic Coding," IEEE Data Compression, 1992 Conference, pp. 299–308.

Howard et al., "Arithmetic Coding for Data Compress," Proceedings of the IEEe, Jun. 1994, pp. 857–865.

Jiang et al., "Parallel design of arithmetic coding," IEE Proce.–Comput. Digit. Tech. Nov. 1994, pp. 327–333.

Primary Examiner—Yon J. Couso

[57] ABSTRACT

An image data encoder and decoder system which divides native or uncompressed image data into a plurality of streams for subsequent arithmetic encoding and decoding operations. Once each stream has been encoded, it may be relayed in its present format to a corresponding decoder unit or combined with other encoded streams to produce a composite encoded stream representing a compressed version of the original image data suitable for external transfer or storage. When stored in composite form, the decoder may include a distributing preprocessor that breaks it back down into its constituent encoded streams to facilitate parallel decoding. After decoding operations have produced plural decoded image streams, a final stage reintegrates them back to the original image data. The matched parallel encoder and decoder architectures permit pipelined processing of image data without necessarily increasing overall processing speeds.

14 Claims, 24 Drawing Sheets

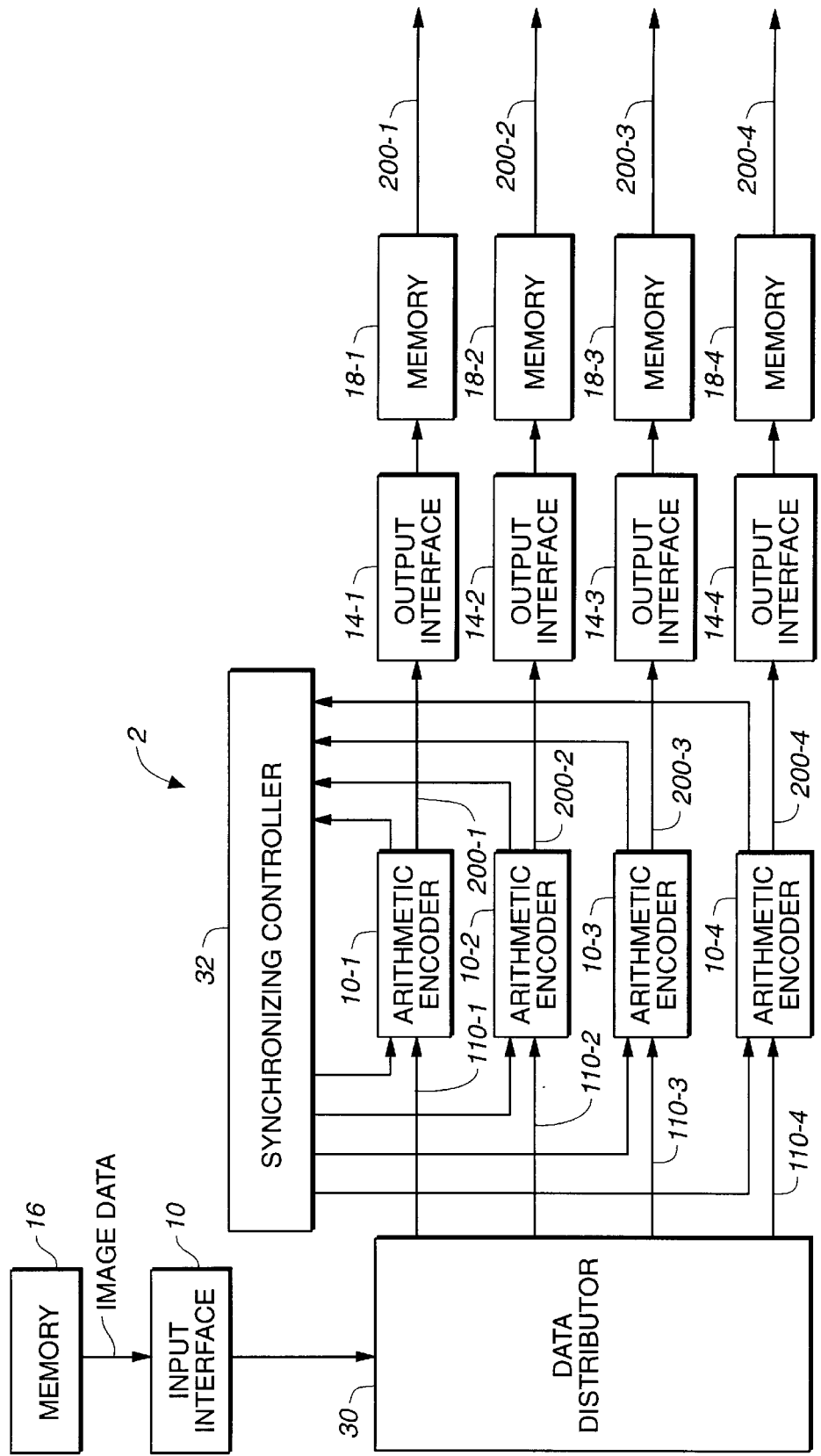
FIG._1A

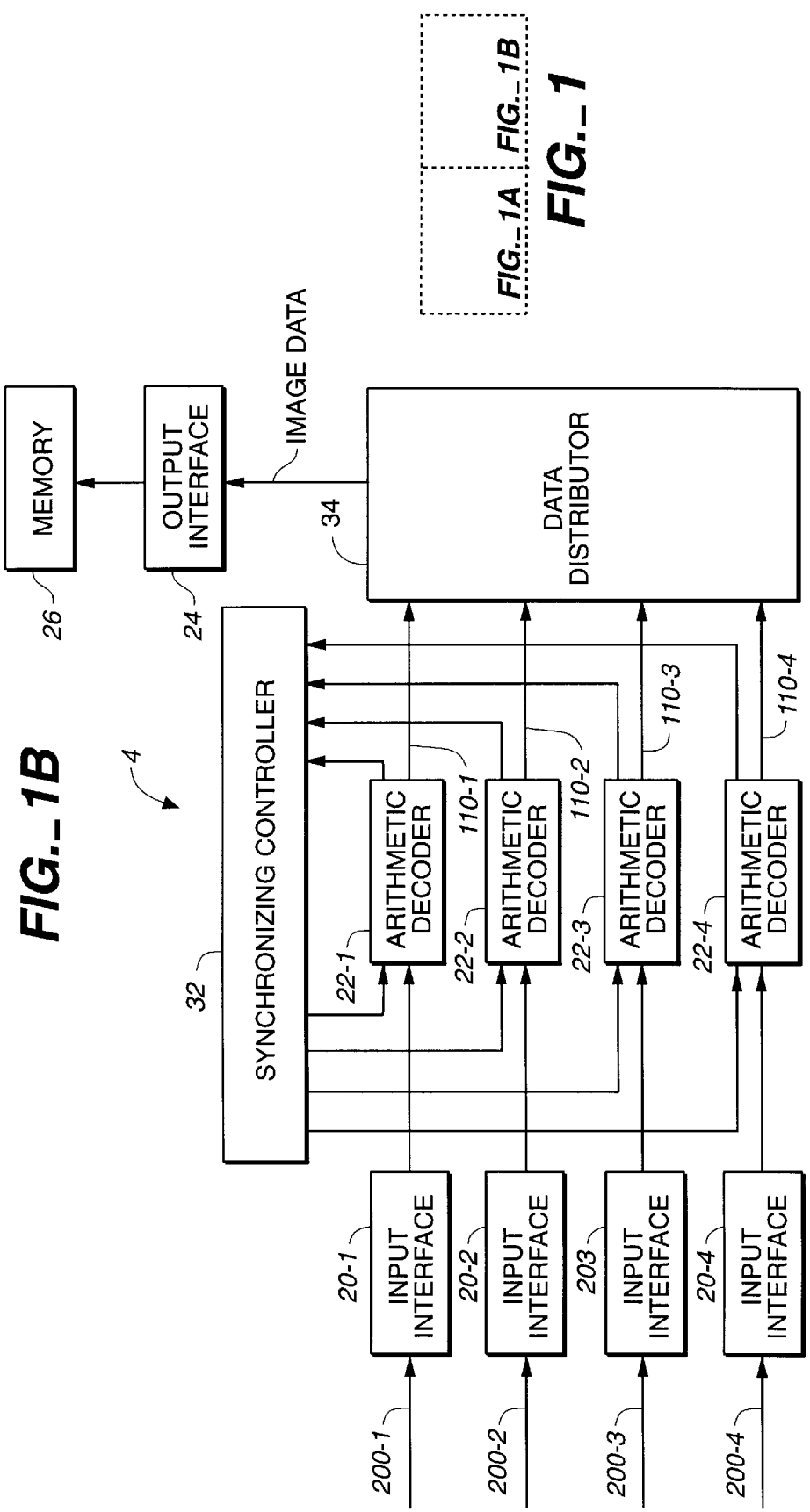

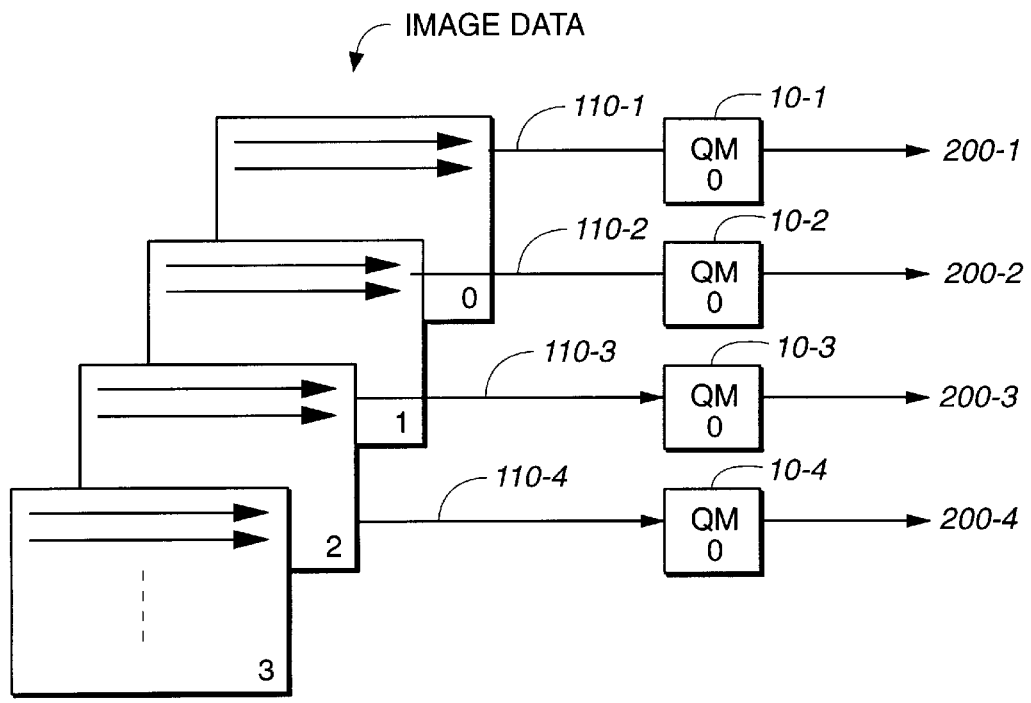
4 BITS PER PIXEL
(16 COLORS)
FIG._2
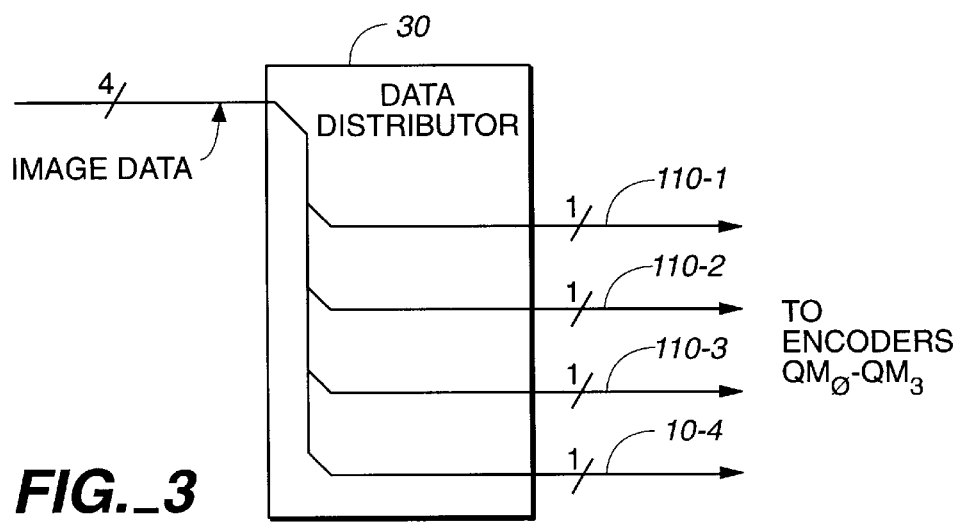
FIG._3

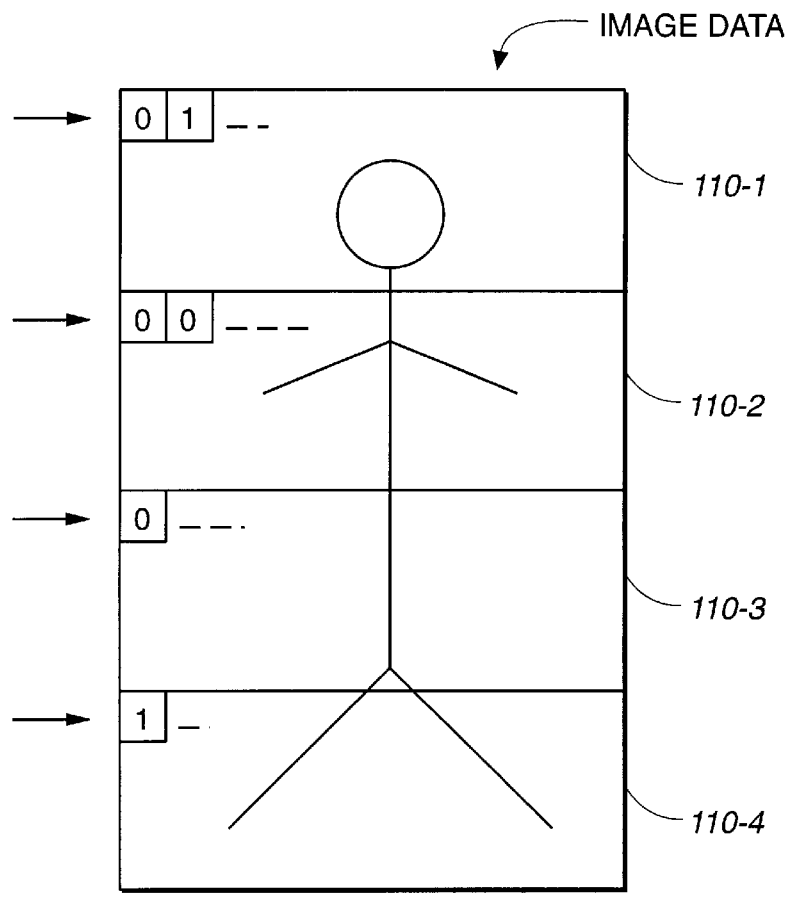
FIG._4
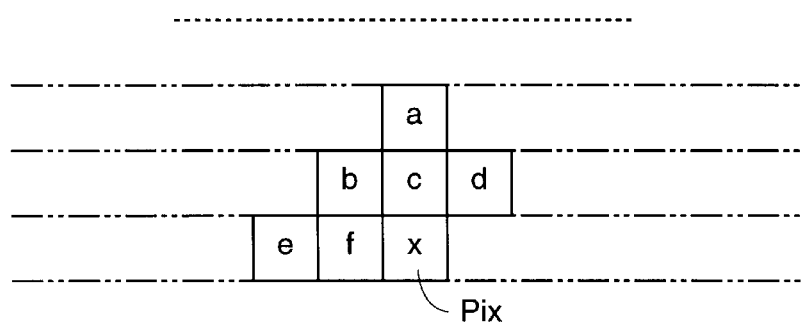
REFERENCE PATTERN OF THE
CURRENT PIXEL x: a, b, c, d, e, f
FIG._7

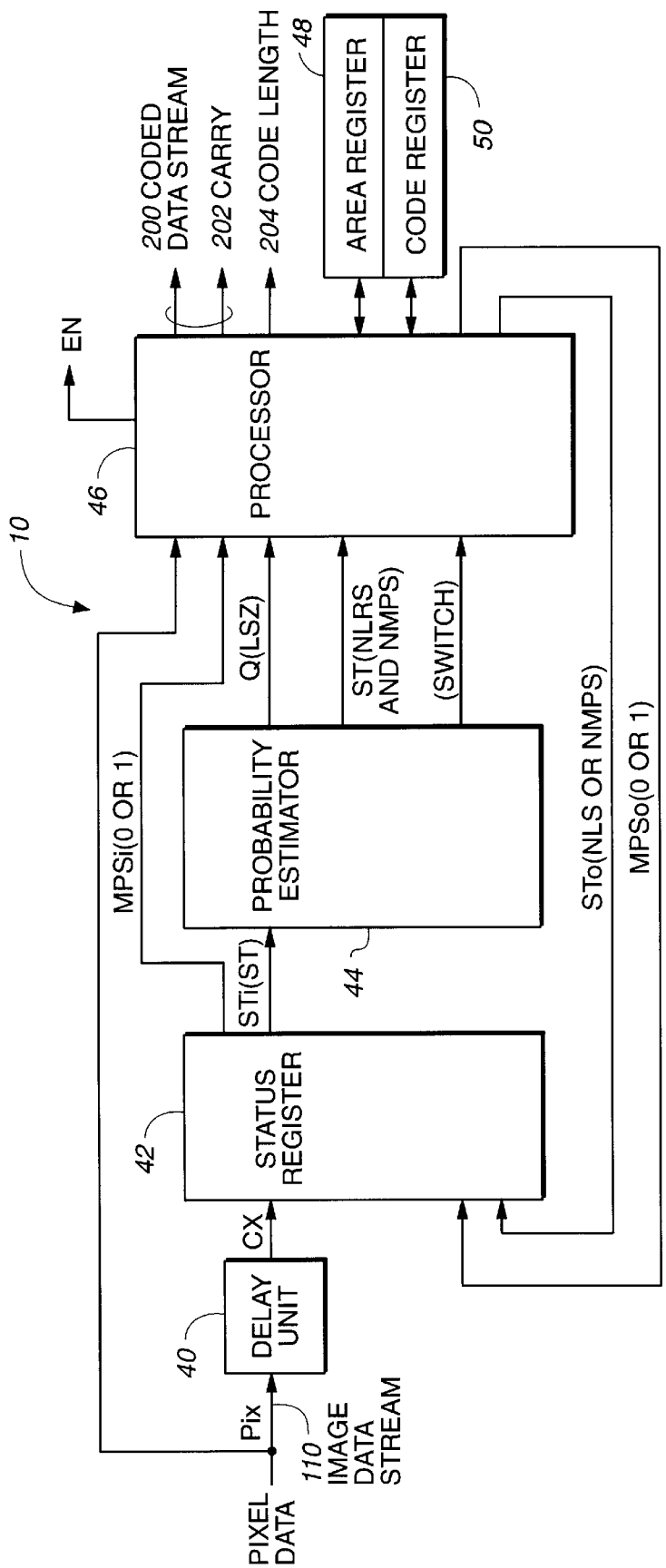
FIG._5

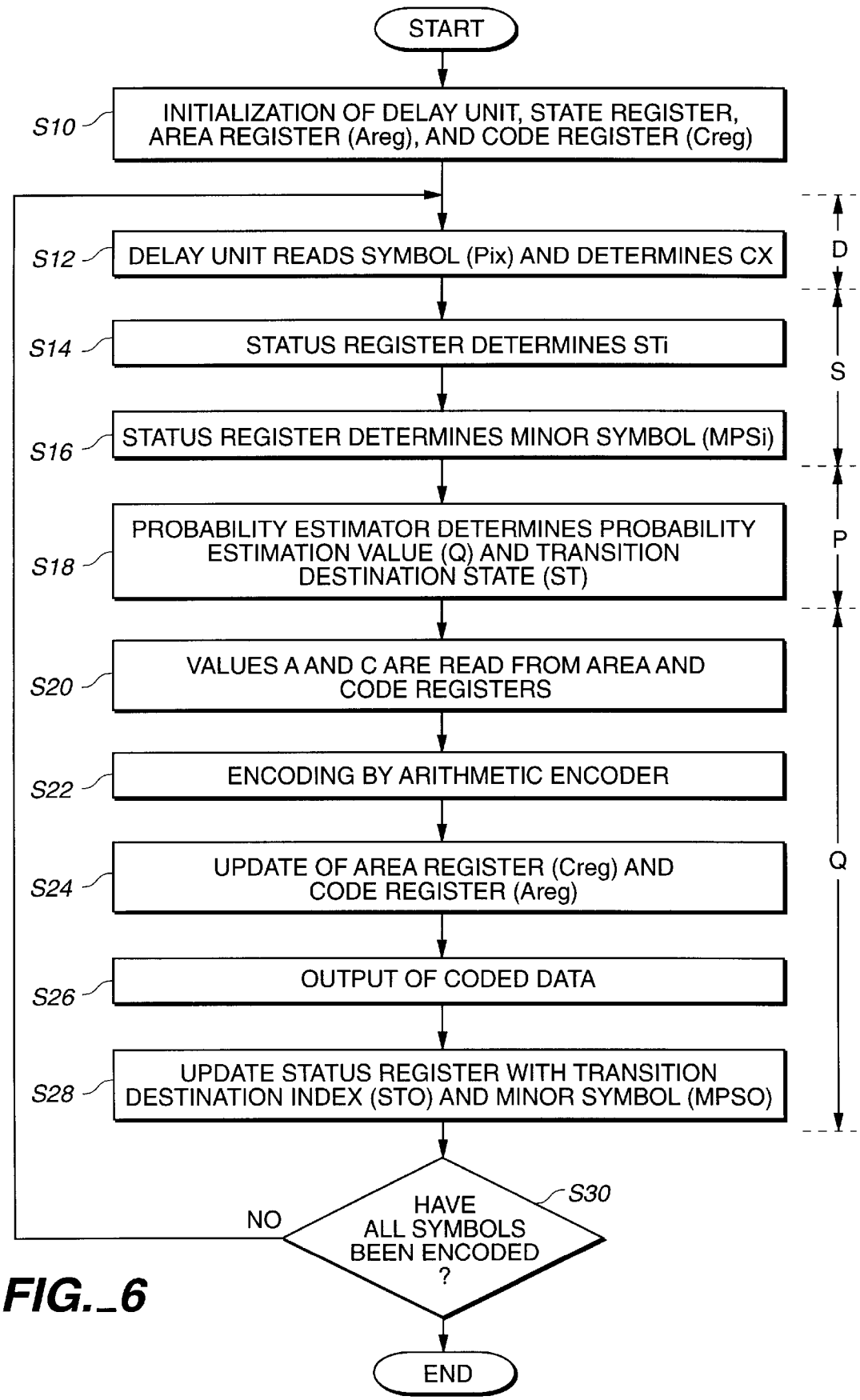
FIG._6

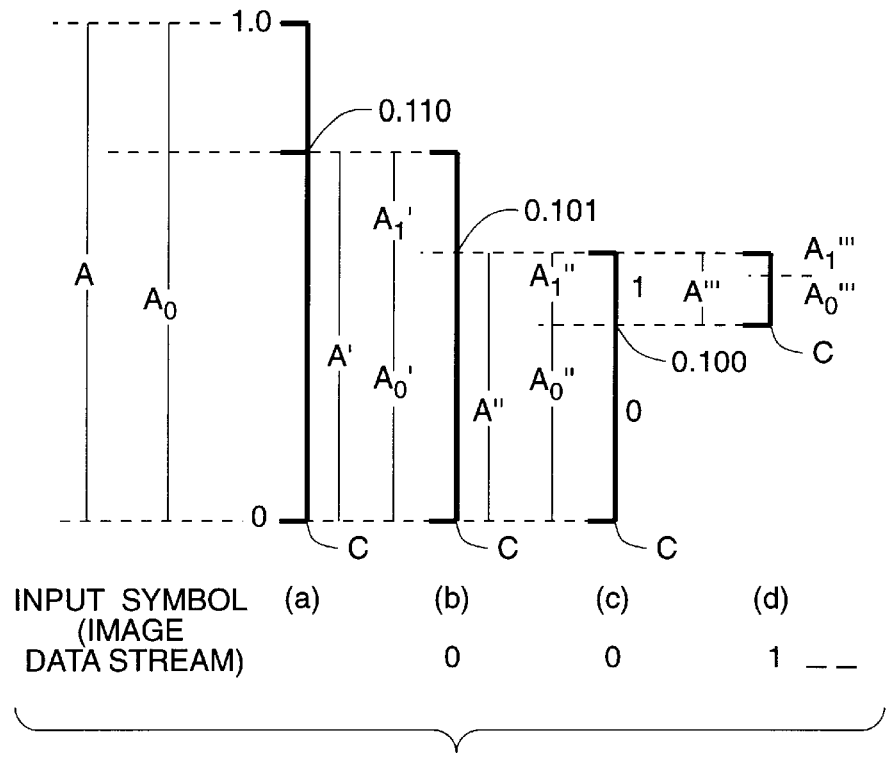
FIG._8A
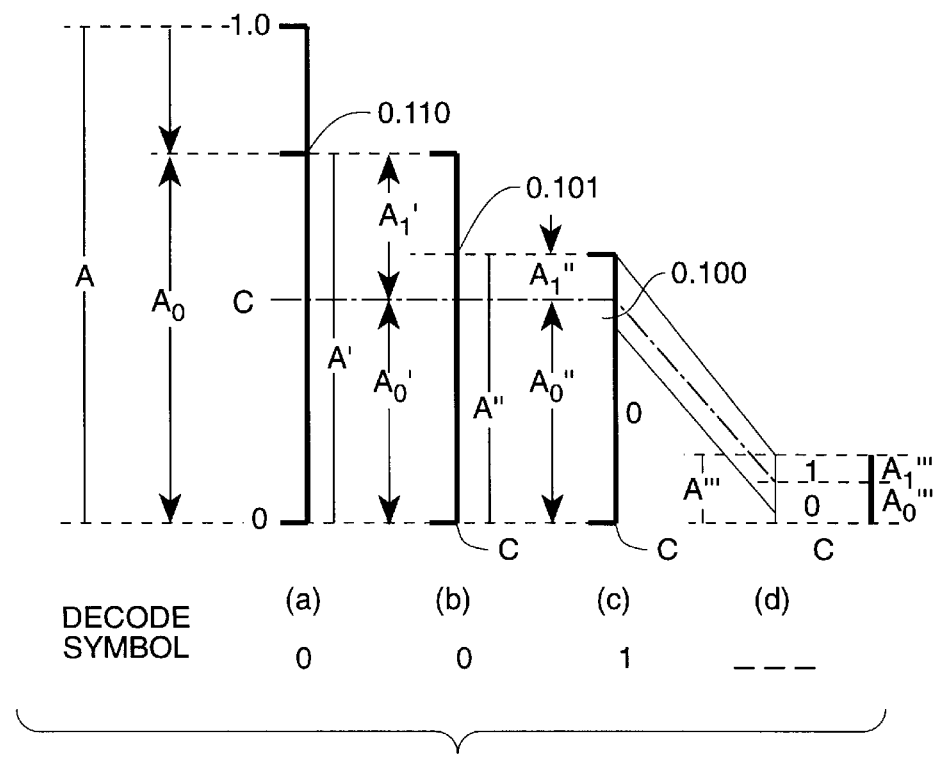
FIG._8B

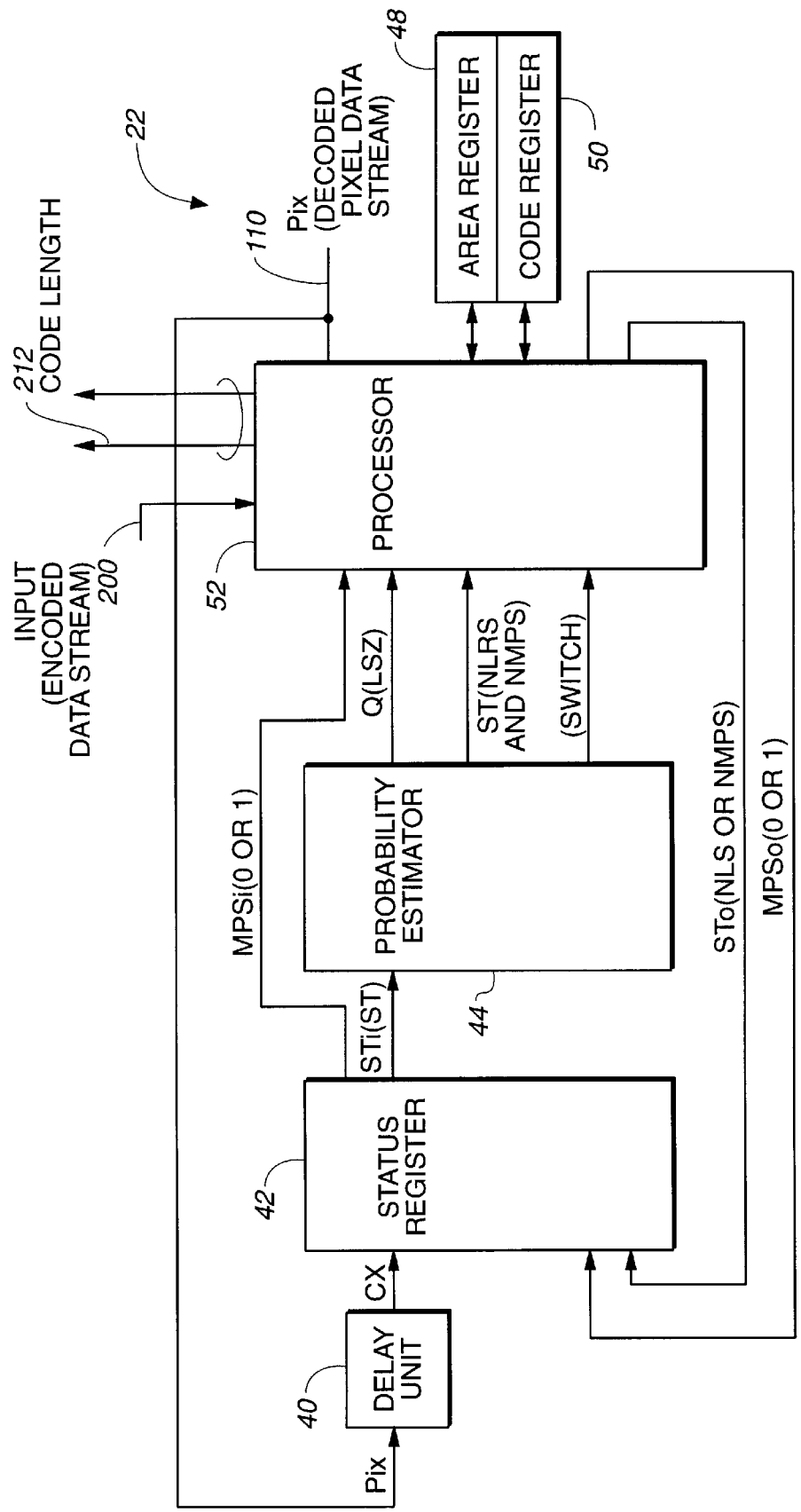
FIG._9

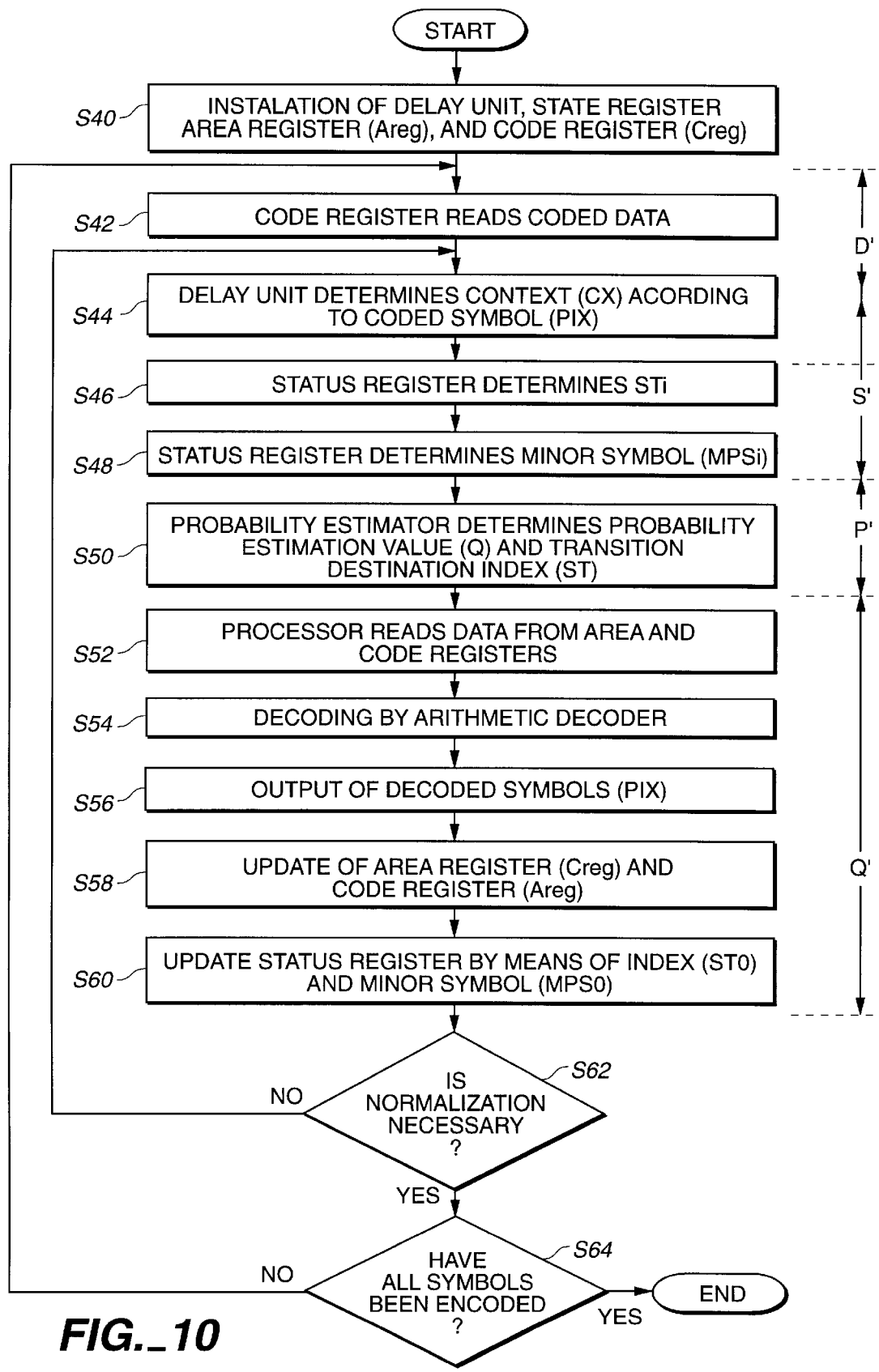
FIG._10

FIG._11A
FIG._11B
FIG._11C
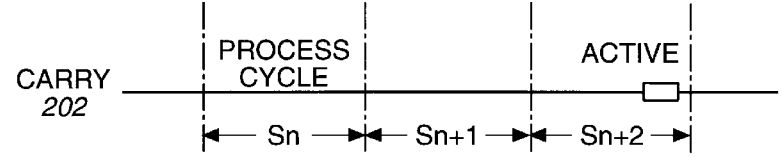
FIG._11D
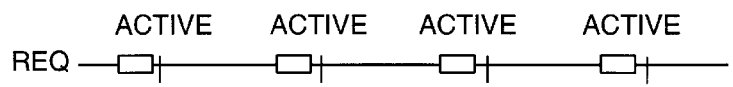
FIG._11E
FIG._11F
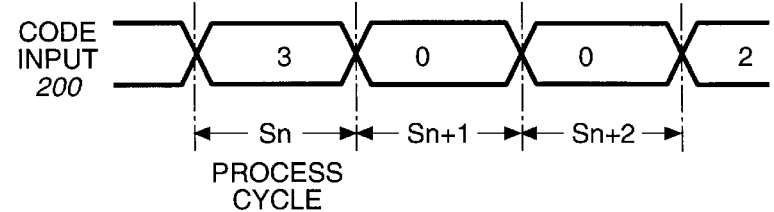
FIG._11G

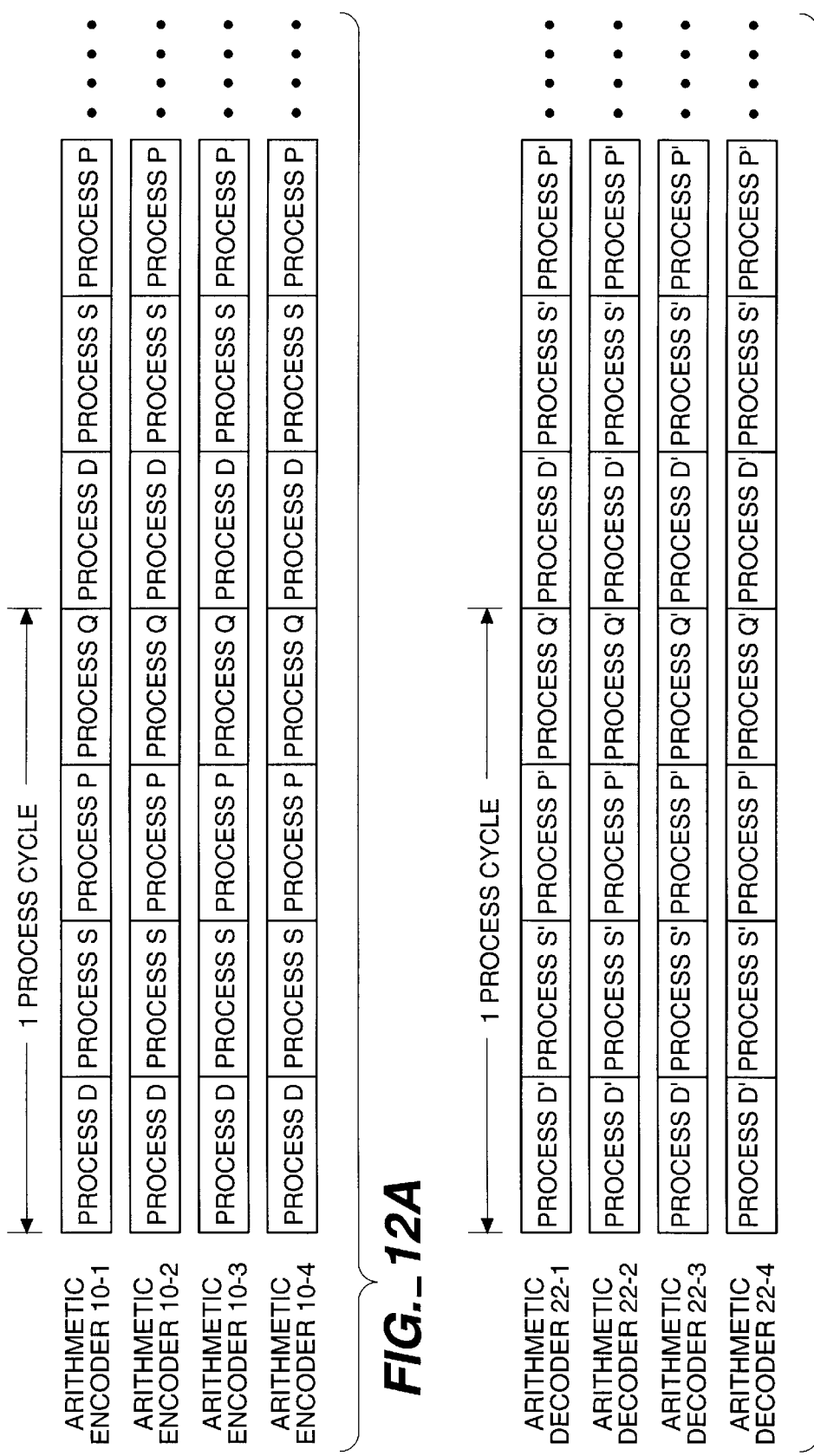
FIG._12A
FIG._12B

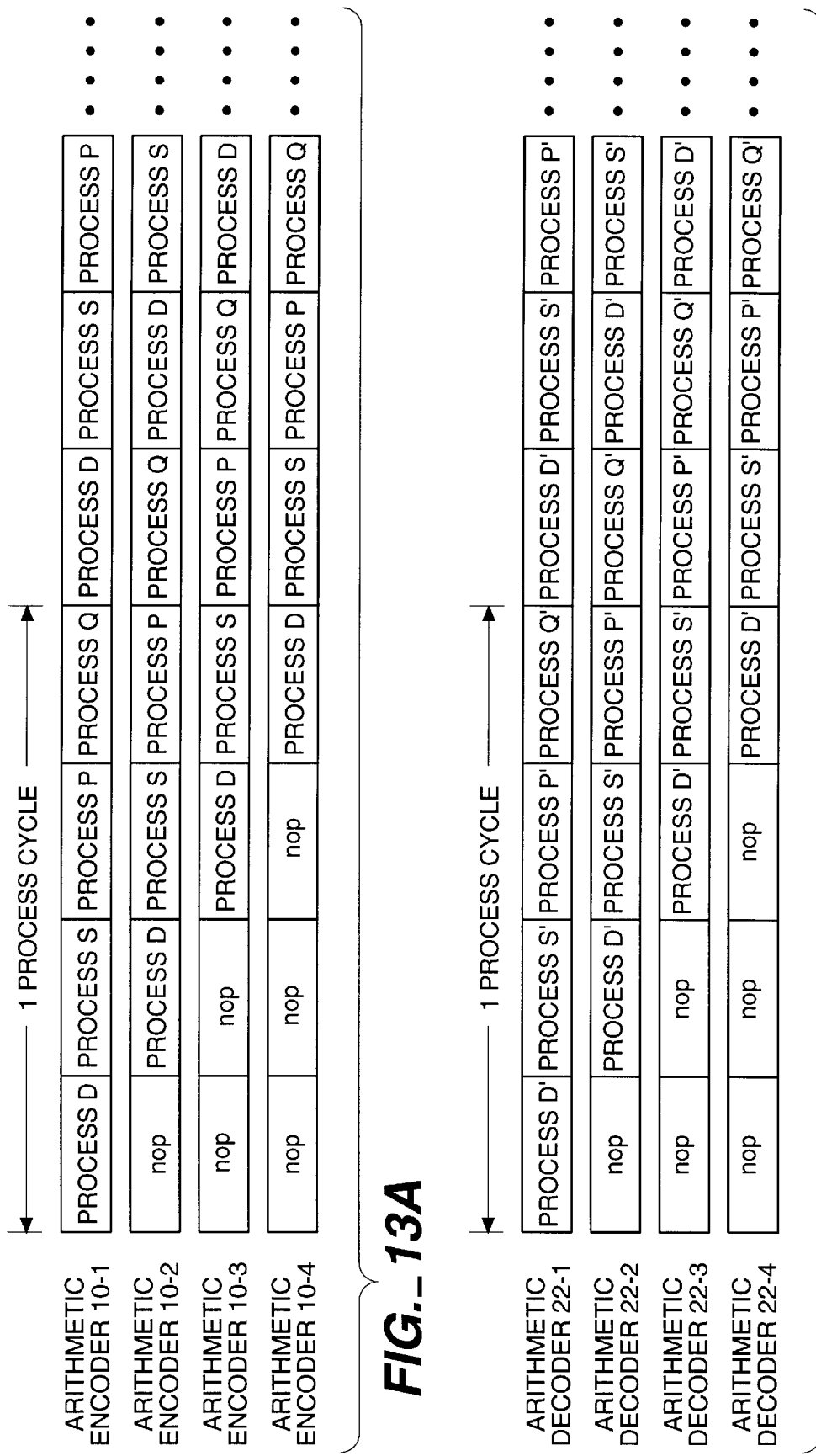

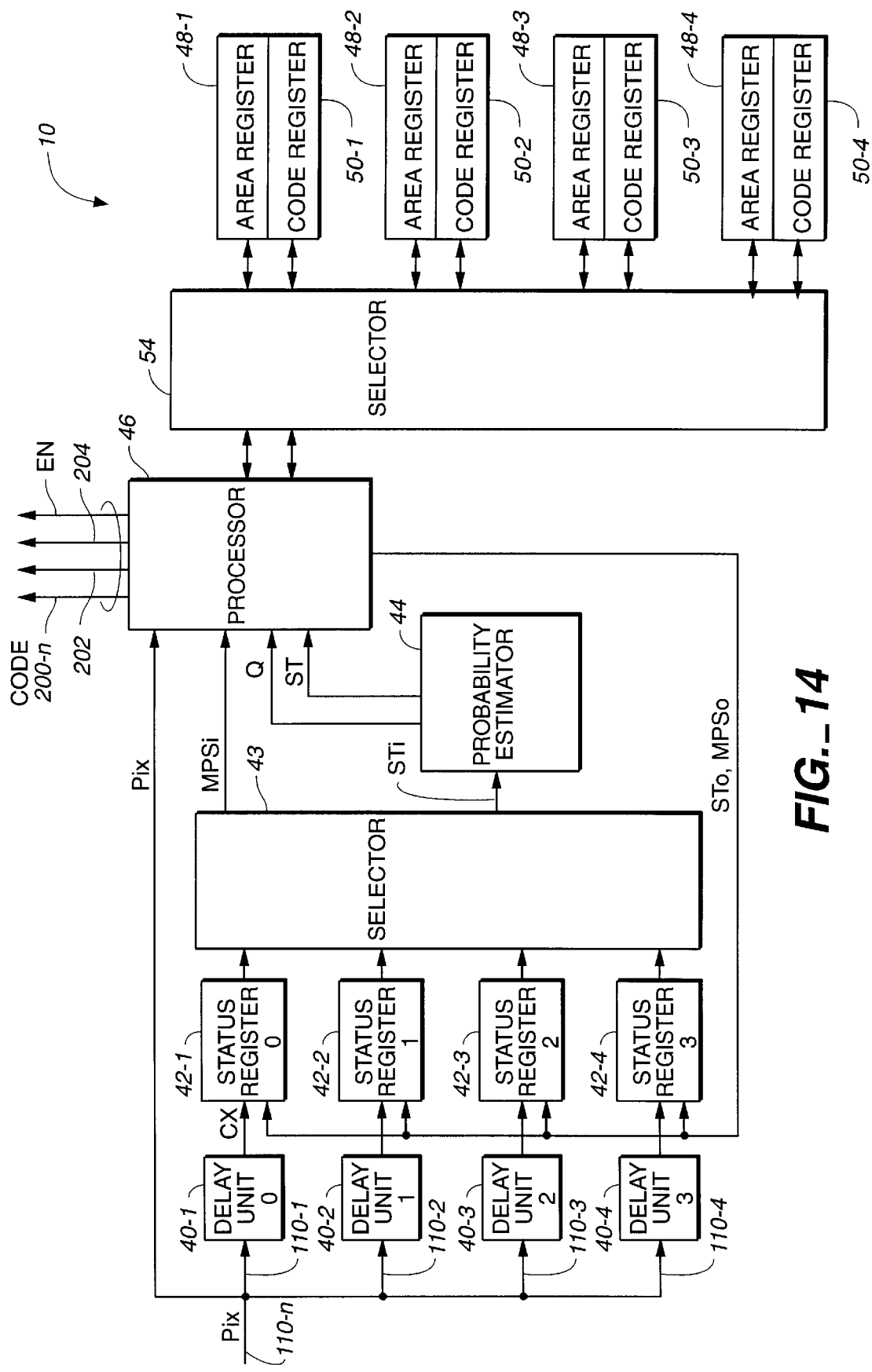
FIG._14

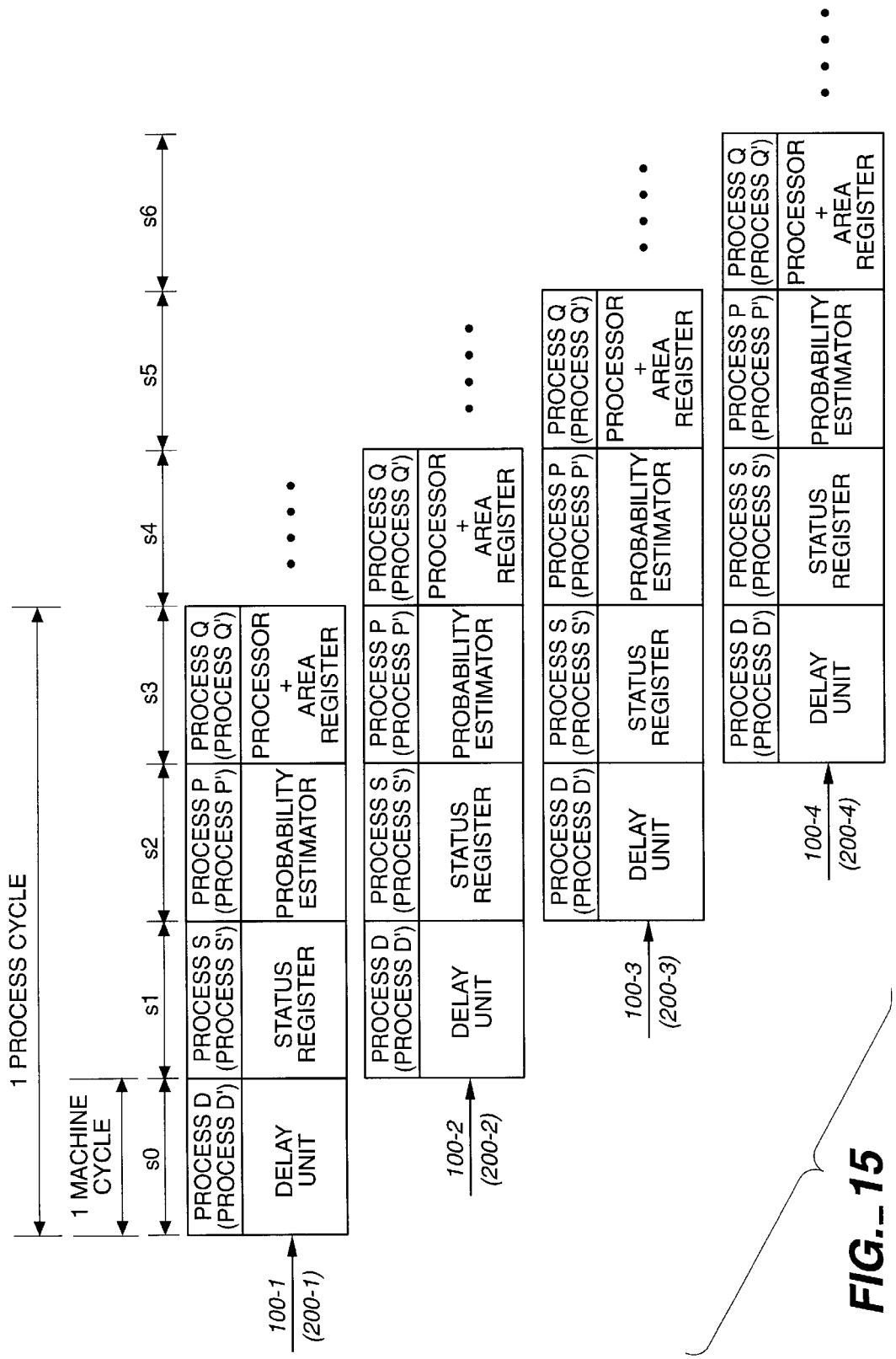
FIG._15

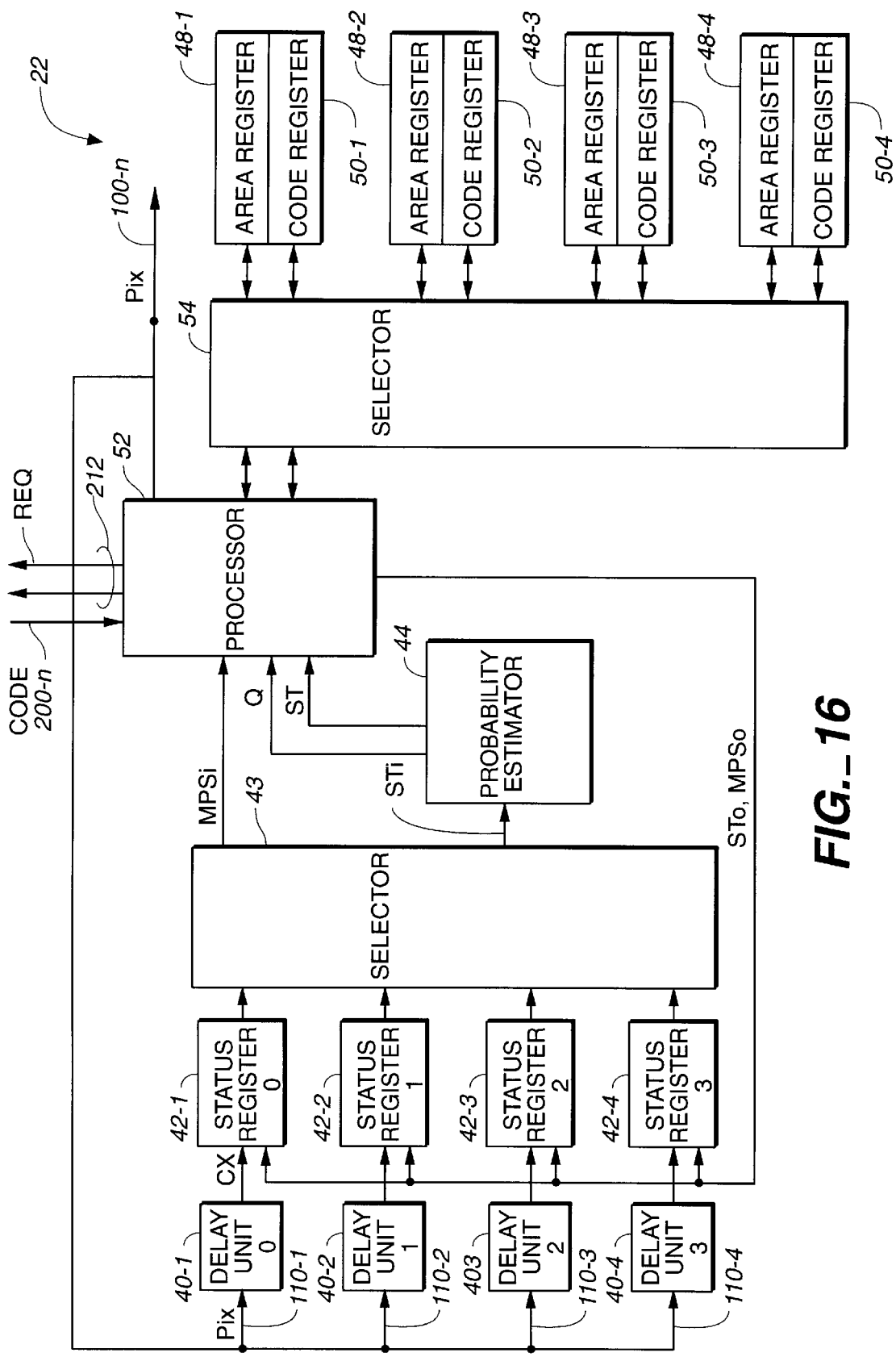
FIG._16

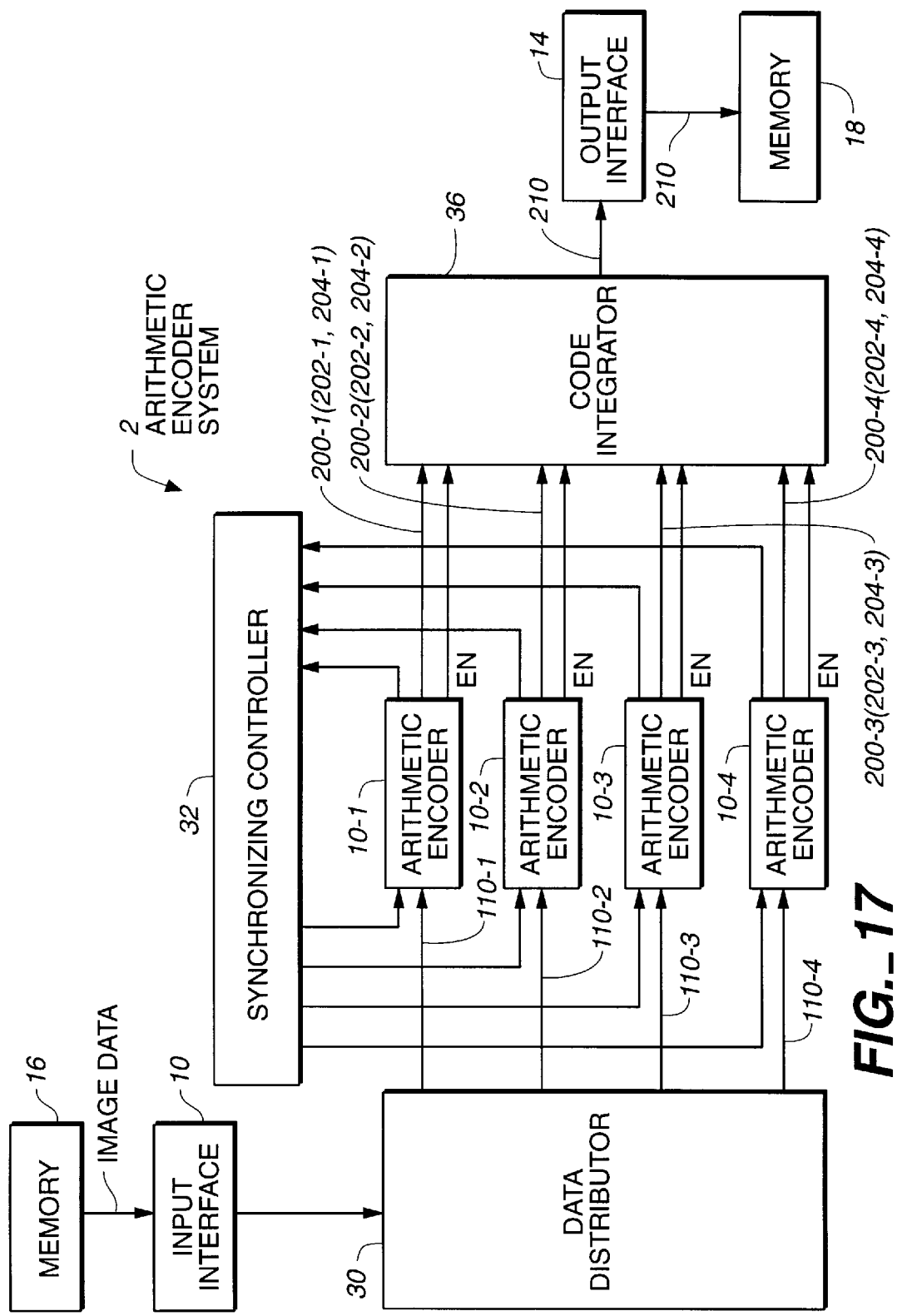
FIG._17

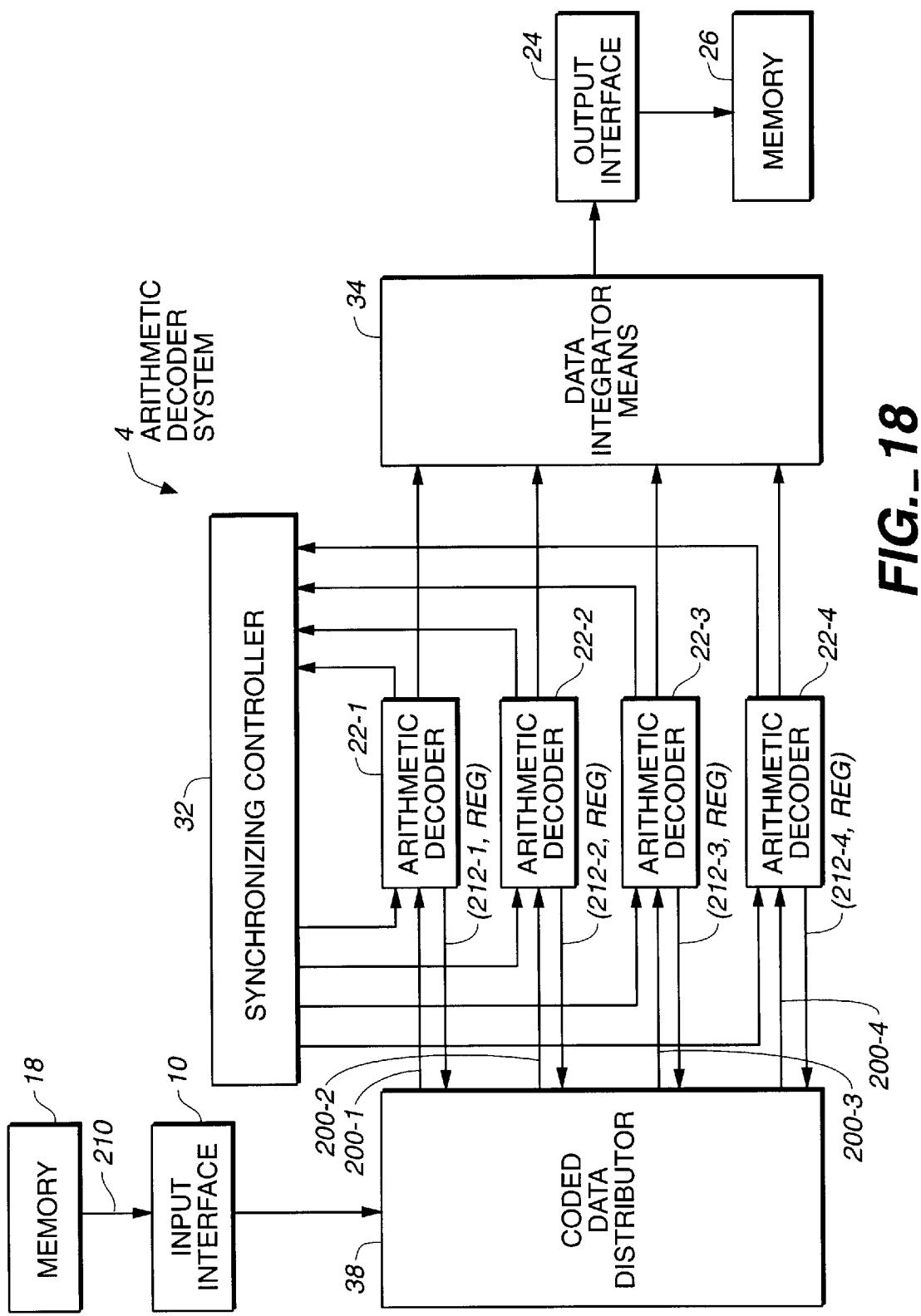
FIG._18

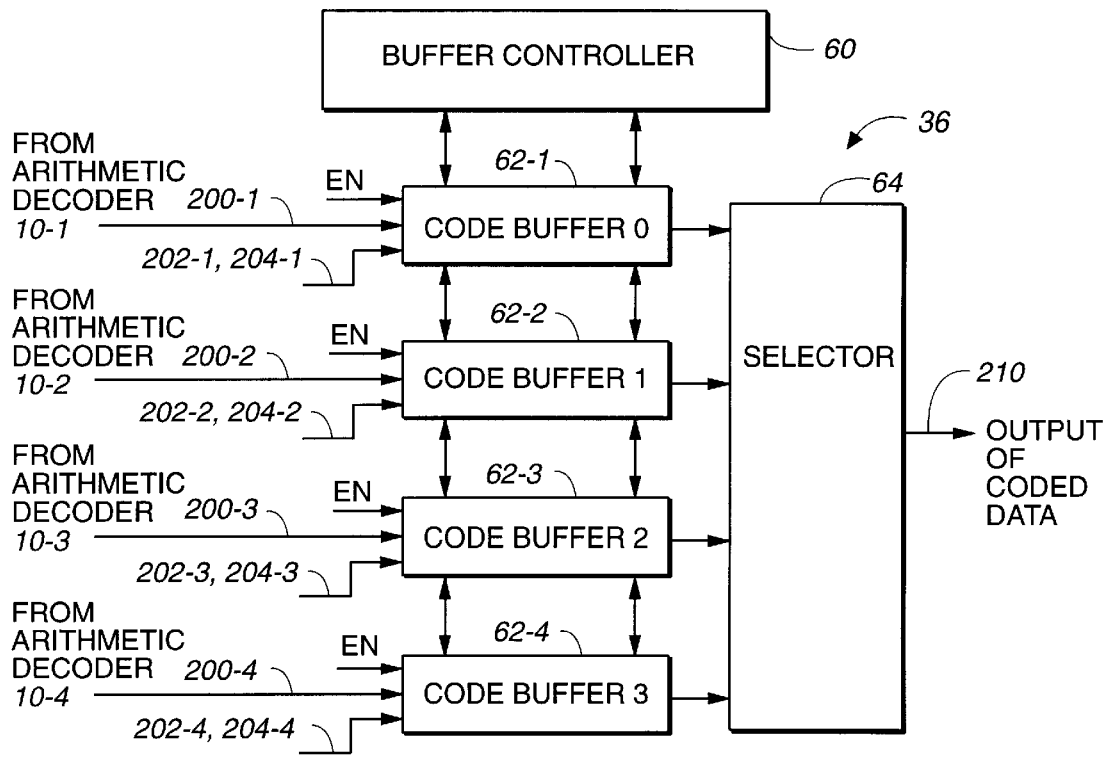
FIG._19
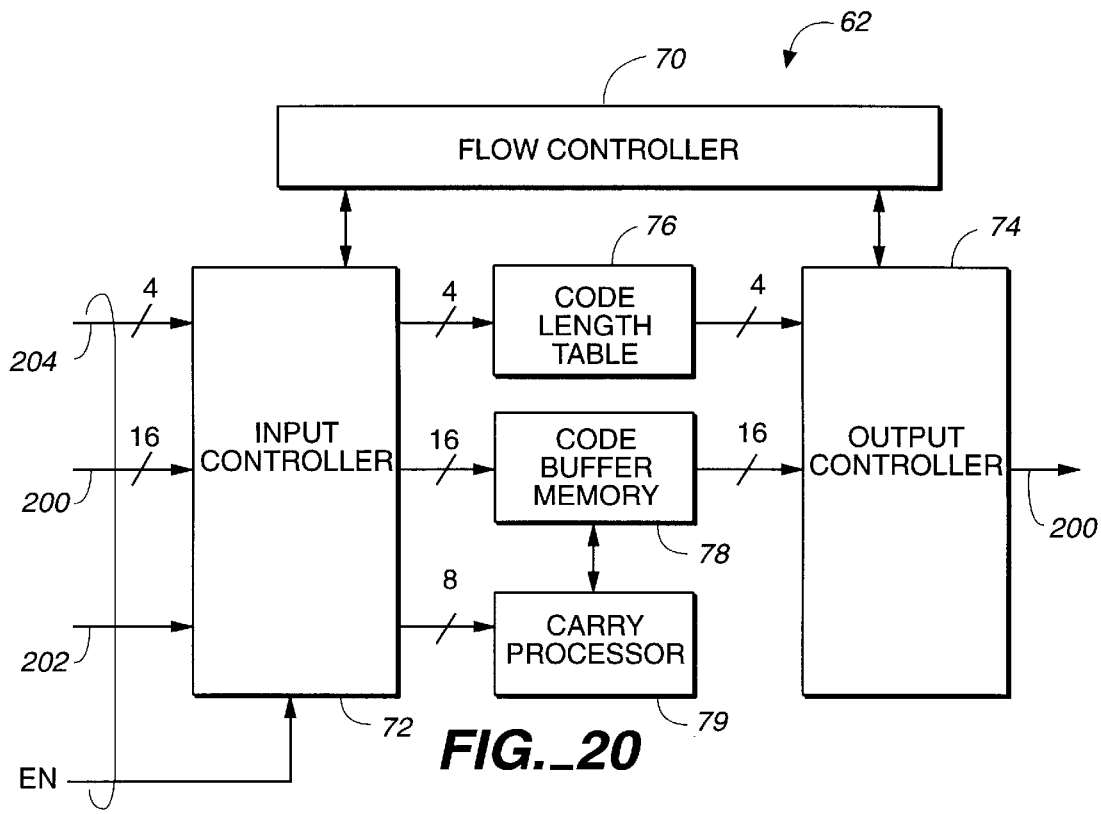
FIG._20

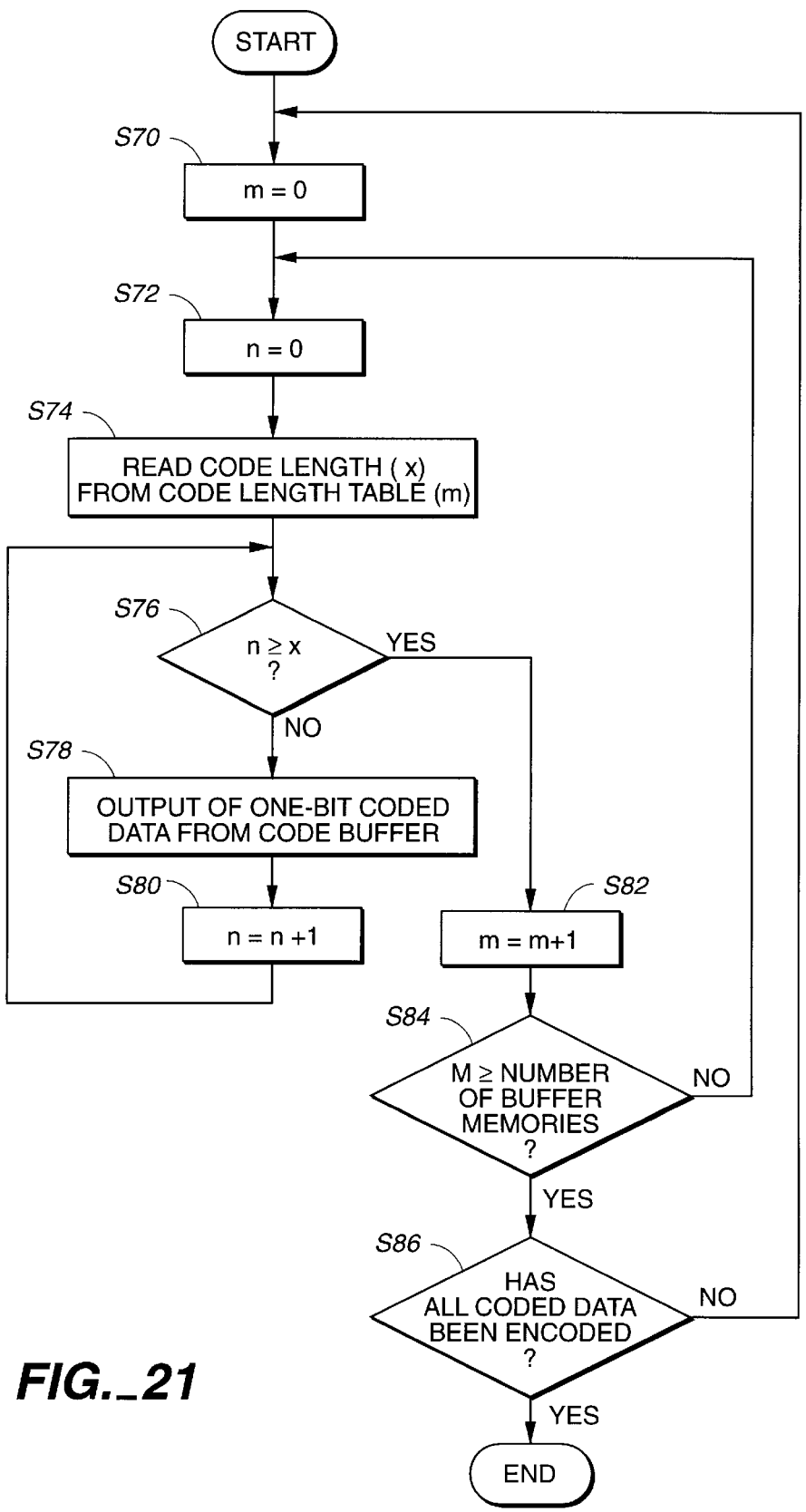
FIG._21

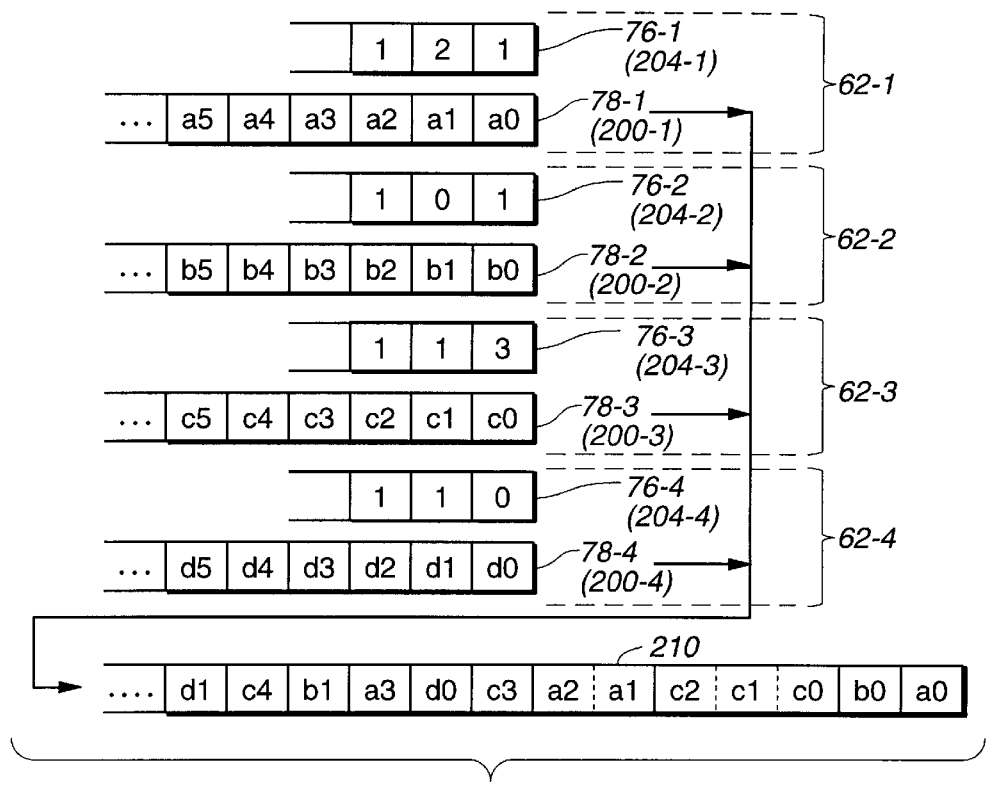
FIG._22
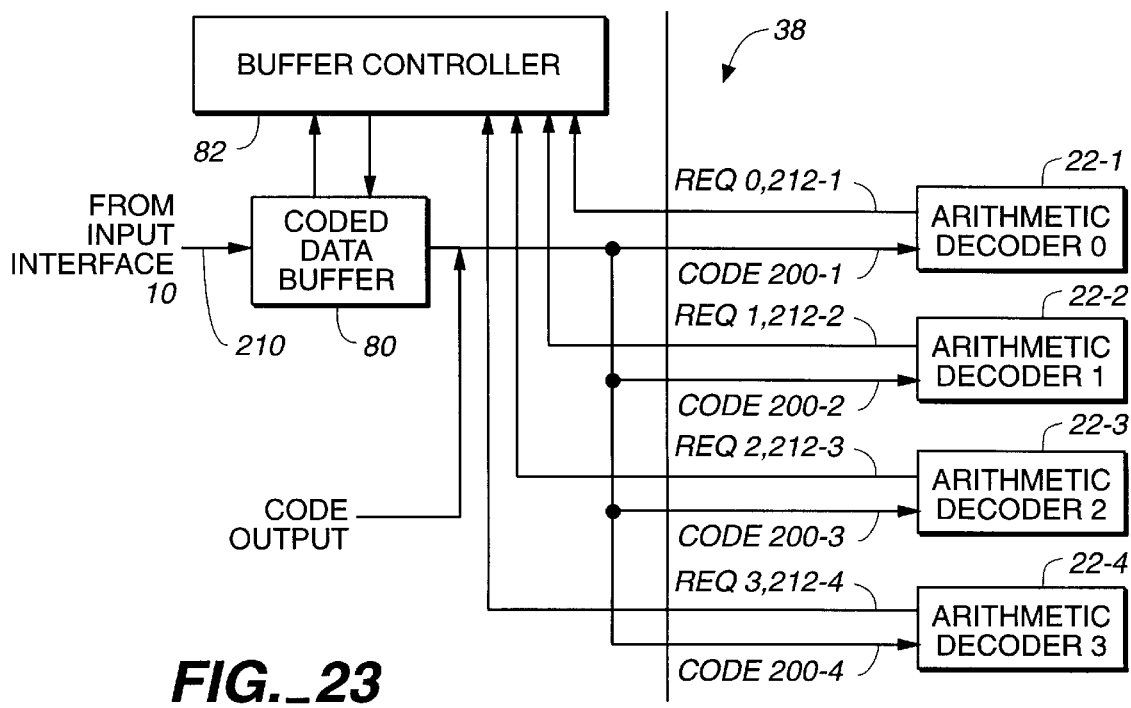
FIG._23

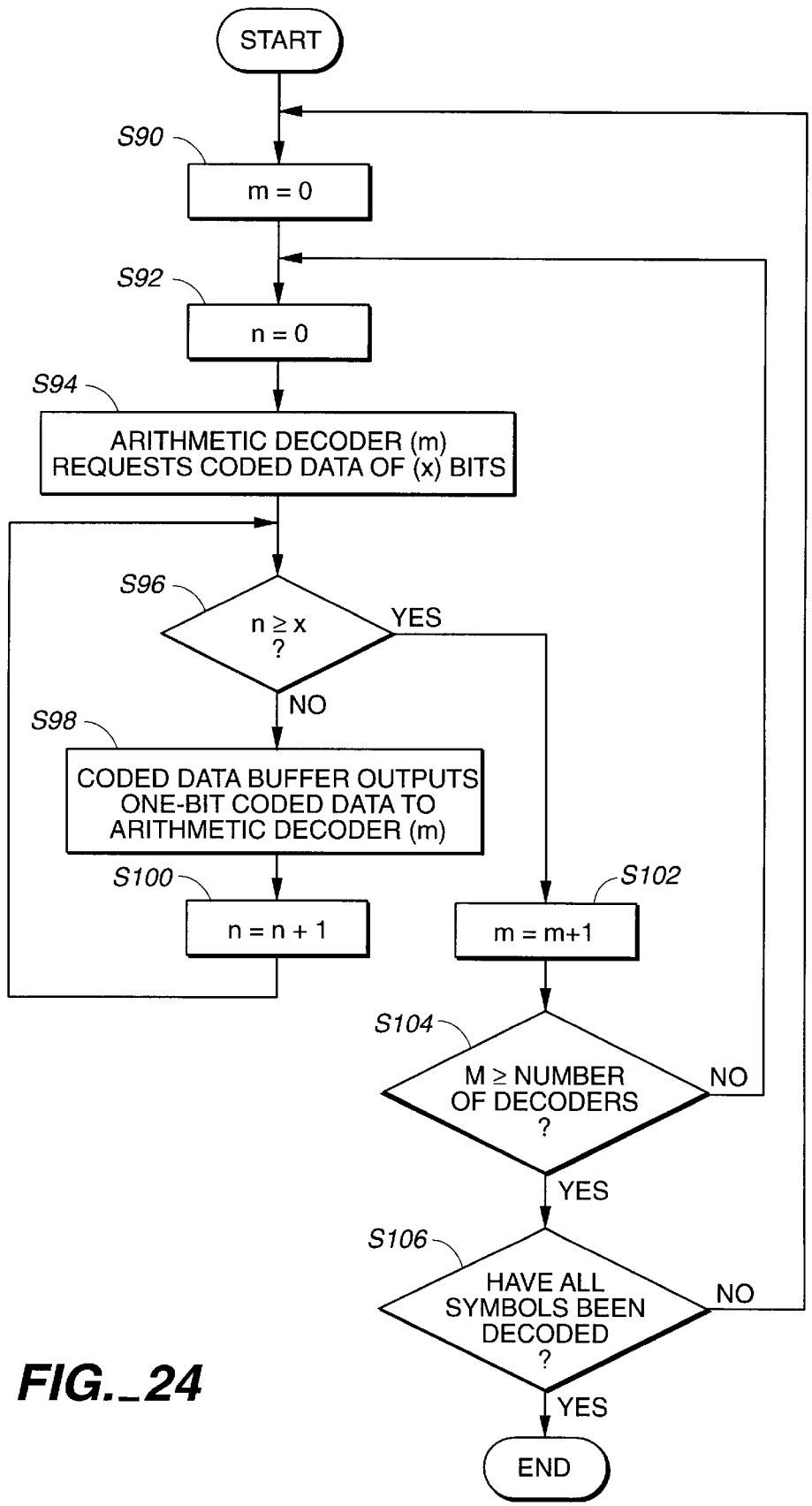
FIG._24

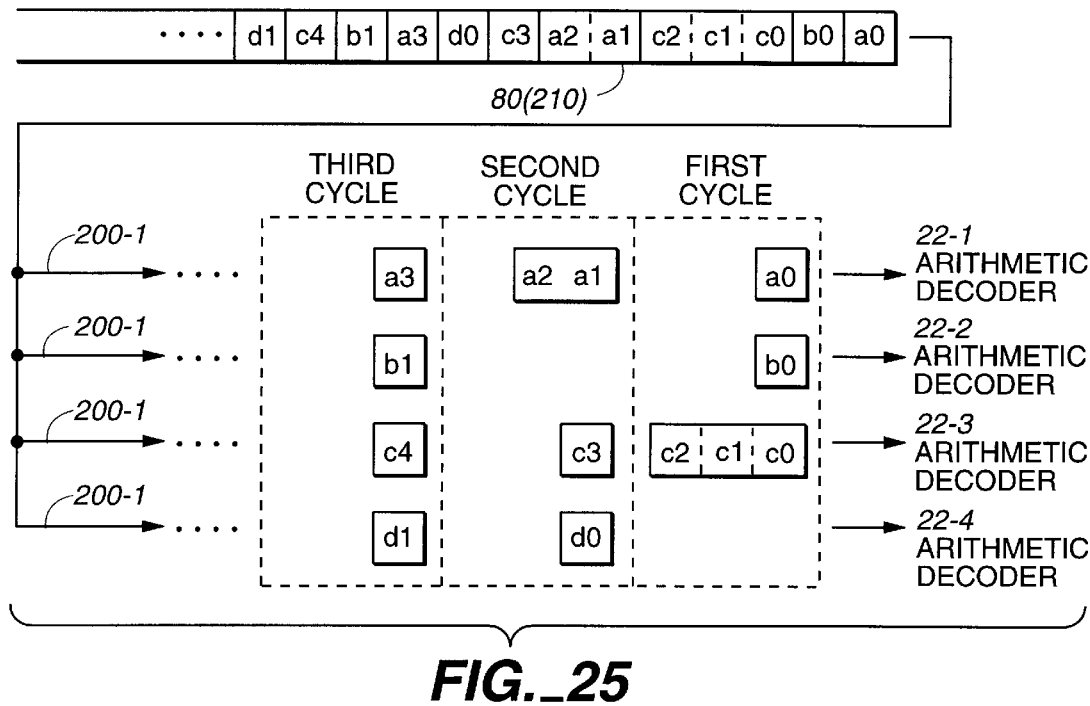
FIG._25
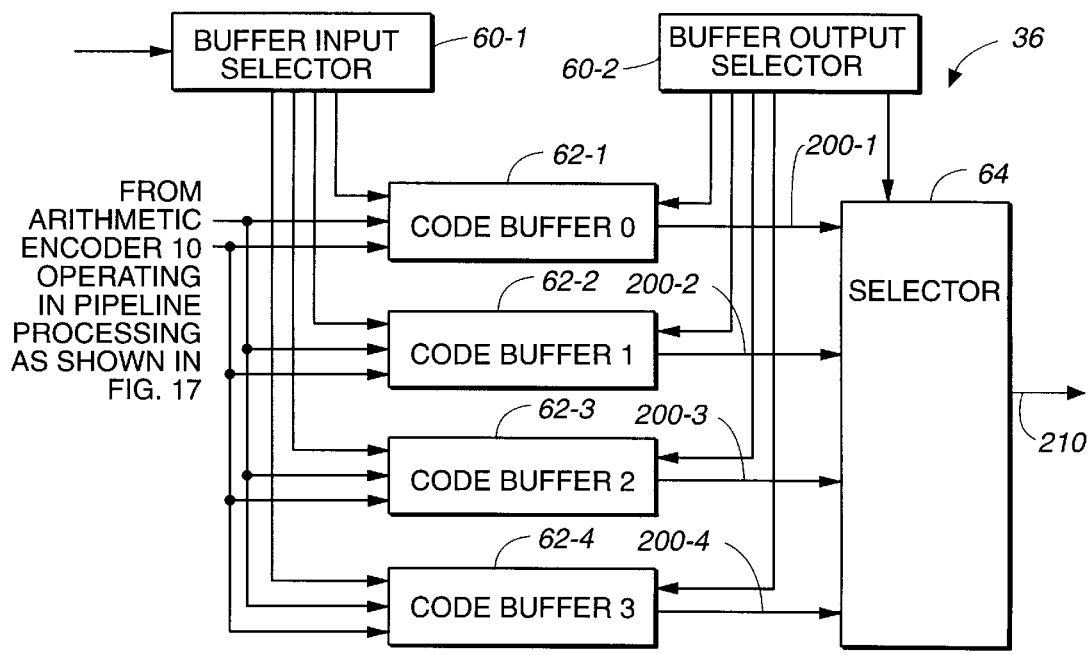
FIG._26

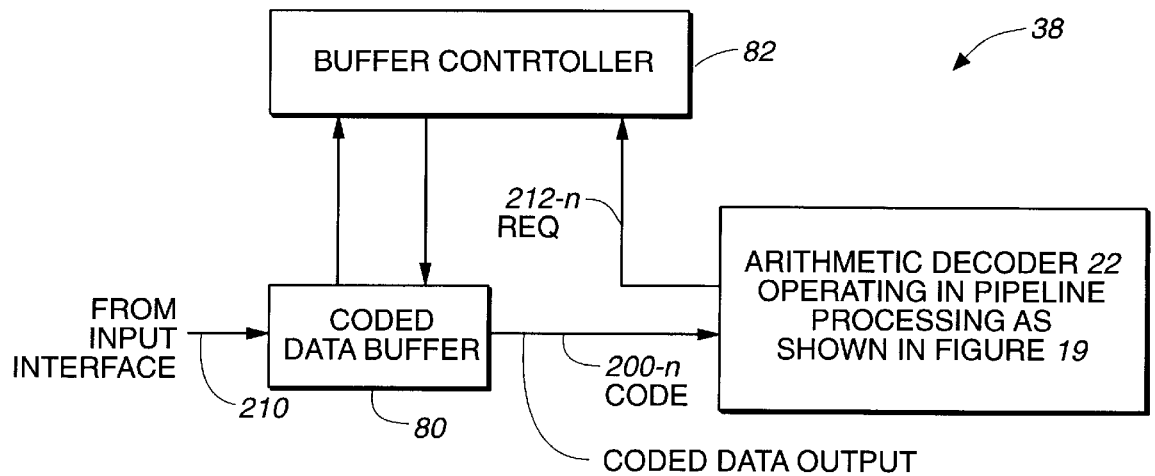
FIG._27
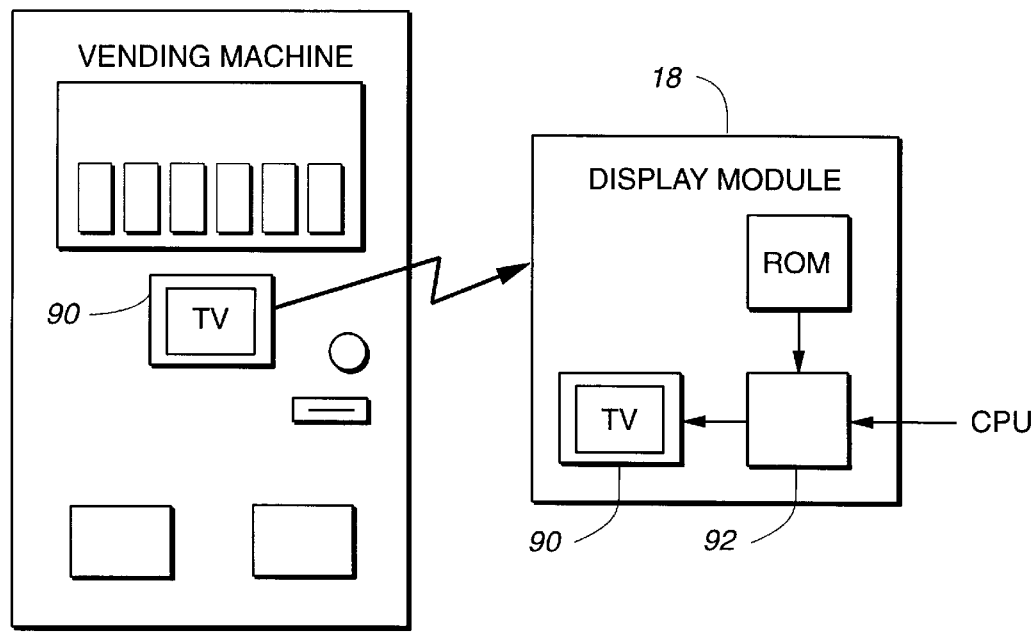
FIG._28

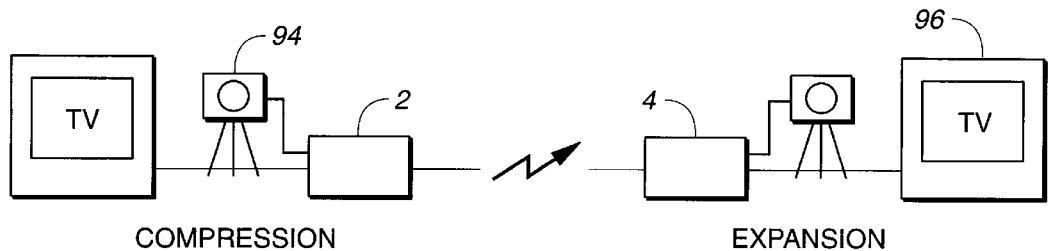
FIG._29
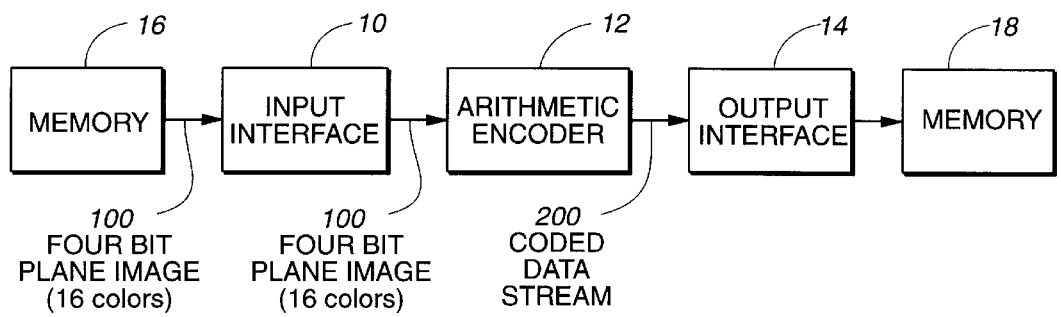
FIG._30A
(PRIOR ART)
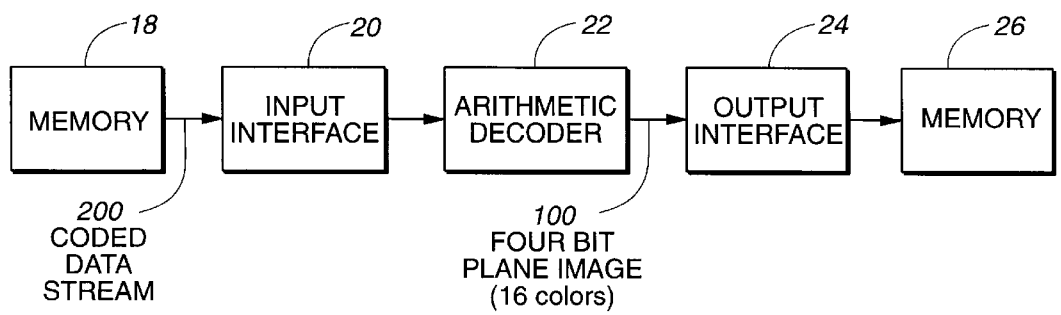
FIG._30B
(PRIOR ART)

IMAGE DATA ENCODER/DECODER SYSTEM WHICH DIVIDES UNCOMPRESED IMAGE DATA INTO A PLURALITY OF STREAMS AND METHOD THEREOF

BACKGROUND OF THE INVENTION

1. Field of the Invention

This invention relates generally to image data encoding and decoding systems, and is particularly concerned with image data encoding and decoding devices and processes employing fast, efficient arithmetic coding techniques.

2. Description of the Related Art

The advent of digital imaging technology has both literally and figuratively propelled video, multimedia and interactive into the forefront of consumer products. It has empowered the masses with the advanced image processing, rendering, and reproduction capabilities heretofore reserved to commercial studios and publishing concerns. This primarily stems from the ease in which data representing the image may be manipulated. Analog to digital conversion has also become somewhat routine, as more and more powerful processors find their way into consumer products.

However, digitized image transfer and storage limitations still remain significant roadblocks to even more widespread acceptance and use, even in the age of gigabyte hard drives, 32 bit bus architectures and the Internet. Simply put, fully-expanded or native digital image data is too large to work with, even for relatively small images or coarse graphics to be a practical storage format. For example, an uncompressed, letter-sized image at 600 dpi resolution and 16 bit color would require several tens of megabytes of bit-mapped storage space and take several minutes to download using a standard ISDN binary connection.

So, in terms of memory capacity and data transfer speed, it is not practical to process native image data. Accordingly, the electronics industry has turned to digital compression as the preferred way to reduce the size of image data, and ultimately increase throughput and storage space. Various data compression techniques have been developed and used for real applications.

Recently, new techniques of data compression called arithmetic encoding and decoding have been attracting attention. The general concept of the arithmetic encoding is described in Japanese Patent Laid-Open Publication SHO 62-185413, Japanese Patent Laid-Open Publication SHO 63-74324, and Japanese Patent Laid-Open Publication SHO 63-76525. As described therein, arithmetic encoding generally involves dividing a line segment contained within the line segment spanning from 0.0 to 1.0 into two unequal subsegments according to the generating probability for the present symbol to encode and maps a series of symbols to line subsegments thus obtained for that series of symbols. This process is repeated recursively. The coordinate of the point contained in the final line segment is expressed in binary representation, which differentiates the point from the points of other line segments, and then the coordinate in binary representation is output as the coded data. The ordinary encoding scheme which assigns a special code for a particular series of symbols is referred to as block encoding, while arithmetic encoding is referred to as non-block encoding.

The arithmetic encoding technique compresses image data efficiently and the compressed data is easily decoded. Therefore, this technique is considered to be more efficient for applications such as the transmission of image data through a transmission line and the storage of image data in various types of memory devices.

Prior art FIG. 30A shows a conventional, general arithmetic encoder system for image data, and FIG. 30B shows an example of an arithmetic decoder system.

The arithmetic encoder system shown in FIG. 30A comprises an input interface 10, an arithmetic encoder 12, and an output interface 14. Responding to the request from arithmetic encoder 12, input interface 10 fetches image data from a memory or transfer mechanism 16 and outputs it in an appropriate manner to the arithmetic encoder 12. A semiconductor memory as well as both magnetic and optical memory devices are common storage examples which could be used as the memory mechanism 16 in this case. Analog/digital telephone lines, local and wide-area computer networks, or radio frequency links could serve as example transfer mechanisms.

Arithmetic encoder 12 compresses image data streams 100 provided through input interface 10 and outputs the compressed coded data stream 200 through output interface 14 to a memory or transfer means 18. Thus, image data 100 is efficiently compressed, and the compressed data is either written to memory 18 or is transferred to the image data decoder system shown in FIG. 3

The arithmetic conventional decoder system shown in FIG. 30B comprises an input interface 20, an arithmetic decoder 22, and an output interface 24. Arithmetic decoder 22 decodes incoming coded data following the exactly reversed procedures of those for arithmetic encoder 12.

Responding to the request from arithmetic decoder 22, input interface 20 fetches coded data 200 from a memory or transfer device 18. Arithmetic decoder 22 decodes coded data 200, provided in sequence, into image data 100 and outputs image data stream 100, through output interface 24, to another memory or transfer mechanism 26.

Thus, for example, a high quality image data transmitter/receiver system may be constructed by using the arithmetic encoder system shown in FIG. 30A for encoding image data 100 to coded data 200 and transmitting it through memory or transfer mechanism 18 and by using the companion arithmetic decoder system shown in FIG. 30B for receiving the coded data and decoding it back to image data 100. This system may be applied to many devices such as digital or HD-TV, digital telephony products and facsimile machines The coded data created from image data 100 with the arithmetic encoder system shown in FIG. 30A can be stored on an IC card or chip, which is used in many different fields. For example, if a motor vehicle navigation system is equipped with the arithmetic decoder system shown in FIG. 30B, one can use the map data which is compressed with the arithmetic encoder system shown in FIG. 30A and is stored in a memory 18 such as IC cards. Since map data contains a large amount of image data, the arithmetic encoder system is particularly suited to compress the map data and write the coded data to an IC card, which has a limited memory capacity.

The system shown in FIG. 30A can compress not only still images but also moving images. Therefore, it can compress a commercial moving image lasting from a few seconds to a few minutes and store the compressed image on an IC chip. The image display device equipped with the system shown in FIG. 30B can replay the commercial image on a display. In promoting a new product, for example, the IC chip that stores the commercial image of the new product can be installed in the display device simply by replacing the old IC chip.

These prior art systems, however, do not allow for the fast arithmetic encoding of image data. Only a limited amount of data can be transmitted with a transfer mechanism and only a limited amount of coded data can be decoded with the system shown in FIG. 30B at a given moment. Therefore, the image displayed on a display device is usually too small for practical application in many situations. Further, when displaying a moving image, a time lapse is required and unnatural, jerky motions result.

More specifically, prior art arithmetic encoder 12 and arithmetic decoder 22 operate at a fixed one bit per clock cycle. Further, every cycle of both encoding and decoding has internal feedback, inhibiting conventional pipelining and multiplexing techniques. Therefore, the only way to conventionally increase the encoding and decoding rates was to increase the driving clock frequencies for arithmetic encoder 12 and arithmetic decoder 22. Such higher clock frequencies demand more expensive and difficult to manufacture semiconductor designs, and ultimately are limited by the capabilities of the semiconductor processes for forming the circuit elements of those devices.

OBJECTS OF THE INVENTION

It is, therefore, an object of the present invention to increase performance in image data encoder/decoder systems without having to increase clock speeds of the constituent elements.

It is a further object of the present invention to provide a relatively high-performance image data encoder/data system using low-cost, simple circuit elements yet capable of carrying out advanced arithmetic compression techniques.

It is yet a further object of the present invention to exploit synchronous pipelining techniques for data encoding or decoding operations.

SUMMARY OF THE INVENTION

To achieve these and related objects, the present invention employs data division techniques to break down the image data in a manner that permits arithmetic encoding to proceed in parallel. More particularly, received, native format image data is distributed into a plurality of individual streams according to a predetermined set of distribution rules. These individual streams are then encoded in parallel by the encoder of the present invention to achieve desired compression results.

For example, when the image data has 16 colors, each pixel datum is represented by four bits. In this case, the image data can be divided into four bit planes. The image data stream of each of the four bit planes can be encoded by means of the arithmetic encoder. Accordingly, four image data streams are created corresponding to the four image planes. Further, the image data can be divided spatially into multiple areas. For example, the image data can be divided into top, middle, and bottom parts, each of which may then be encoded in parallel.

To achieve parallel encoding, the presently preferred embodiments may include a plurality of dedicated arithmetic encoders, each corresponding to a potential image data stream. Each dedicated arithmetic encoder encodes one of the distributed native image data streams and outputs the results in synchronization with one another either simultaneously or staggered in a predetermined delay. Since each image data stream produced by data distribution is encoded by the corresponding dedicated arithmetic encoder, each need only treat only a single image data stream during a given cycle. This affords a simple encoding circuit within each dedicated encoder. More importantly, the multiple dedicated arithmetic encoder architecture permits pipelining of encoding functions, thereby improving overall throughput and efficiency of large-scale image data compression tasks.

Also, the preferred embodiments of the present invention may include data integration for combining the individual encoded data streams into a single integrated coded or packed data stream in accordance with one or more prescribed combination rules. Combining the individual streams in this manner allows for efficient data transfer and storage than continuing to treat them individually. For example, even if the individual divided image data streams, prior to encodation, may contain the same amounts of data, the coded data streams associated therewith may not, as is the case with most variable width compression techniques. This creates the problems in allocating memory and orchestrating data transfer tasks of the individual coded data streams. However, combining the individual coded data streams into a single integrated coded data stream, allows for efficient memory allocation (since only one area need be reserved). Also, an integrated stream inherently presents the data in proper order for data transfer operations.

In addition, since the preferred embodiments may combine the coded data streams into a single, integrated, coded data stream in accordance with prescribed rules, redividing of the integrated coded data stream sent to the image data decoder system into a plurality of coded data streams is performed quite easily, as will be discussed hereinbelow.

Data integration, according to the preferred embodiments, may be implemented using a plurality of buffers for sequentially storing the individual coded data streams that are produced by the arithmetic encoder. These buffers can also handle carry signal transfers as appropriate. A buffer controller can be utilized for commanding each of these buffers to send out the coded data according to the predetermined order, especially when the possibility of the carry transfer is small. Finally, the buffer controller directs a code combining circuit for combining the individual coded data streams as buffered into a single integrated coded data stream sequenced according to the predetermined order.

Carry transfer is an important issue since, if a carry transfer takes place during the integration of the individual coded data streams, it affects the coded data already integrated. Hence, the buffer controller means determines the possibility of carry transfer based on the data stored in each of the buffer means. It controls each buffer means to output the coded data according to the predetermined order when it determines that the possibility of carry transfer is low, and the single integrated coded data stream is formed from the coded data streams without the influence of the carry transfer.

Further, preferably, these data integration buffers may include a first-in-first-out ("FIFO") buffer memory for storing in sequence the coded data that is produced by the arithmetic encoder, a first-in-first-out code length memory for storing the code lengths in sequence every time the coded data is input to the FIFO buffer memory and a carry transfer processor for performing carry transfer for the coded data stored in said buffer memory every time the arithmetic encoder sends out the carry signal of the coded data. The carry transfer processor performs the carry transfer for the coded data stored in the buffer memory every time the arithmetic encoder sends out the carry signal of the coded data. Thus, the data integration buffer receives the coded data, performs the carry transfer, and stores the code length of the coded data. Also, the buffer controller regulates the buffer memory's sending out in sequence the coded data stored therein having the code length indicated by the code length memory. Therefore, the FIFO buffer memory outputs in sequence the coded data of each pixel datum of the image the arithmetic encoder encodes, which permits easy combination of the individual coded data streams within the code combining circuit.

Furthermore, the preferred arithmetic encoding technique involves, for each time a complete pixel datum is presented within an individual image data stream is provided in sequence, dividing a predetermined encoding line to create a new encoding line, following prescribed rules, using the symbol generating probability of the pixel data, maps the data stream to the coordinate C of the point included in said new encoding line, and sending out the coordinate as the coded data. This technique proves useful in achieving tight compression results. To achieve this, each dedicated arithmetic encoder preferably includes: 1) a context generator for creating the reference pixel data for the present pixel data contained in the individual image data stream the arithmetic encoder is assigned to process and for generating a context signal CX in response thereto; 2) an index generator for producing the optimum transition destination index STi as a function of both the context signal CX and another transition destination index ST0 provided thereto; 3) a probability estimator for outputting the table data corresponding to the generated optimum transition destination index STi, the table data being stored therein and including, for each table index ST, the symbol generating probability for at least one of the major and minor symbols, the transition destination index NLPS when a minor symbol is generated, and the transition destination index NMPS when a major symbol is generated; 4) an area register for storing the length data A of the new encoding line created for each incoming input pixel data; 5) a code register for storing the coordinate of the point included in the new encoding line created for each incoming input pixel data, the coordinate being referred to as the position coordinate data C; and 6) a processor to handle various associated encoding tasks preferably on a per pixel datum basis.

More specifically, as each pixel datum forming the image data stream is sent to the arithmetic encoder means of the presently preferred embodiments, it is initially received by the context generator and encoder processor. The context generator generates the reference pixel data for the present pixel datum from portions of the image data stream already received and relays it to the index generator formatted as the context signal CX.

In turn, the preferred index generator relays to the probability estimator the optimum transition destination index STi as a function of the incoming context signal CX and the transition destination index ST0 provided by the encoder processor. The index generator obtains the optimum transition destination index STi from the two-dimensional information of the context CX and the transition destination index ST0. The optimum transition destination index STi may be computed every time the context CX and the transition destination index ST0 are received or a table for the index STi may have been prepared in advance for the matrix of CX and ST0.

The preferred probability estimator stores the table data, including the symbol generating probability and the transition destination indices NLPS and NMPS, for each table index ST. It outputs to the processing means the corresponding table data every time the optimum transition destination index STi is received.

Moreover, every time a pixel datum is provided, the preferred encoder processor computes a new encoding line, based on the length data A and the position data C of the encoding line stored in the area and code registers and the table data provided by the probability estimator means, and then obtains the length data A and the position data C for the new encoding line. It replaces the contents of the area and code registers with the new data A and C. The encoder processor next determines whether the incoming pixel data is a major symbol or a minor symbol. It then sends NMPS to the index generator when it determines the pixel data is a major symbol, or NLPS when it determines the pixel data is a minor symbol, as the next transition destination index ST0 in the predetermined timing.

Finally, the preferred encoder processor performs normalization operations when the length data A of the encoding line becomes less than the predetermined standard value. It does so by preferably shifting the bits of the data stored in the area and code registers to the encoding line so that the length data A becomes equal to or larger than the predetermined standard value, and outputs the overflowing data from the code register as the coded data together with the code length data.

In particular, according to the preferred embodiment, the symbol generating probability, which is one of the table data values of the probability estimator means, is not set at a fixed value for each table index but is set at a value variable according to the status of the index. For example, the symbol generating probability can be arranged for each index so that the position data (coded data) of the code register means quickly converges to a stationary value. That is, the variation of the symbol generating probability may be set as a large value in the beginning of the encoding, but as a small value when the position data starts to approach a stationary value. Together with the encoder structure discussed above, this feature gives rise to tight and efficient image data compression.

In another aspect of the present invention, the preferred embodiments may also include arithmetic decoding which can process, in parallel, the plural coded data streams produced by the arithmetic encoder to provide respective decoded imaged data streams, and a data integrator means for combining said decoded image data streams to form the original image data. Preferably, the coded image data produced by the arithmetic encoder means is decoded back to the original image data with the arithmetic decoder means using the exactly reversed procedures of the arithmetic encoder. That is, the image data decoder system of the preferred embodiment processes, in parallel, each coded data stream produced by the image data encoder system using an arithmetic decoder and outputs the results as the decoded image data streams. It then combines the individual decoded image data streams to form the original image data using a data integrator.

In this decoding method, multiple coded data streams are decoded in parallel into decoded image data streams which, then, are combined together to form a single original image data. Thus, the image data decoder system of the present invention can decode a large amount of coded image data in a short time.

To complement encoded data integration tasks described hereinabove, the preferred arithmetic decoder may include data division which divides the integrated coded data stream created by the image data encoder into a plurality of coded data streams in accordance with prescribed rules similar to that used for encoding integration. When the image data encoder system forms a single integrated coded data stream, it must be redivided into the same multiple coded data streams as there were before the integration.

Furthermore, the preferred arithmetic decoder can, upon decoding each coded data, generate the code length needed for decoding the next coded data, and pass this back to data division processing. In turn, the data division component uses this code length to correctly fetch the next series of code area from the integrated code data stream.

Note here that the image data decoder and encoder systems of this invention preferably operate in the exactly reversed processes in decoding and encoding the image data, respectively. This means that the work load for encoding the image data should be the same as that for decoding the coded version of the same data. Every time the arithmetic decoder means performs the decoding process on each coded datum, the code length of the coded data to be decoded next is automatically determined. Thus, according to the present invention, the integrated coded data can be divided into a plurality of coded data streams using the code length information provided by the preferred arithmetic decoder. Special data needed for dividing the integrated coded data stream does not have to be included within the coded data stream, as the decoder operates on the inherent structure of the code. This improves the efficiency of data compression and greatly simplifies both the image data decoder and encoder systems' structure.

Like data integration discussed in relation to the encoder system of the preferred embodiments, data division is preferably carried out in the decoder through use of FIFO buffers which temporarily store the integrated coded data stream information commanded by a buffer controller, which, responding to the arithmetic decoder that generates the code length of the coded data to be decoded next, reads the coded data having that code length from the buffers and sends the coded data to said arithmetic decoder. This data division architecture permits high speed search and retrieval of code data having the code length specified by the arithmetic decoder from the integrated coded data stream stored in the buffer means. It further permits parallel operation by several dedicated arithmetic decoders when decoding speed is at a premium.

To this end, the image data decoder system according to the disclosed embodiments can preferably include several dedicated arithmetic decoders, each corresponding to one of the coded data streams generated prior to data integration by the encoder system. As with the preferred parallel arithmetic encoder architecture, each dedicated arithmetic decoder decodes its assigned coded data stream and generates corresponding decoded, uncompressed image data in synchronization with the other dedicated decoders either concurrently or at a staggered stages or delays. This also enables pipelining the parallel decode stages to increase overall throughput, and reduces the complexity of each decode circuit.

Further, according to the presently preferred embodiments, the arithmetic decoder reiteratively divides the predetermined decoding line into major and minor areas according to the symbol generating probability for the pixel data, outputs as the decoded pixel data the symbol associated with the divided area to which the input coded data belongs, and defines that divided area as the new decoding line. This organization allows the compressed coded data stream to be decoded efficiently by using a predetermined decoding line which corresponds to the above-described encoding line as well as reversing the procedures of the image data encoding according to these embodiments.

Accordingly, the structure of each preferred dedicated arithmetic decoder includes: 1) a context generator for creating the reference pixel data for the coded data to be decoded next with reference to the decoded image data stream produced in the past and for outputting the reference pixel data as the context signal CX; 2) an index generator for producing the optimum transition destination index STi as a function of said context signal CX and the transition destination index STo; 3) a probability estimator for outputting the table data corresponding to the optimum transition destination index STi, the table data being stored therein and including, for each table index ST, the symbol generating probability for at least one of the major and minor symbols, the transition destination index NLPS when a minor symbol is generated, and the transition destination index NMPS when a major symbol is generated; 4) an area register for storing the length data A of the every newly created decoding line; 5) a code register for storing the input coded data C; and 6) a supervisory decode processor.

The preferred context generator component of each decoder creates the context signal CX for the pixel to be decoded next with reference to the decoded image data stream produced in the past and sends it to the index generator.

The preferred index generator produces the optimum transition destination index STi as a function of the input context signal CX and the transition destination index ST0 provided by the processing means and outputs it to the probability estimator.

The probability estimator of the preferred dedicated arithmetic decoder reads the table data of the probability estimation table corresponding to the input optimum transition destination index STi and sends it to the decode processor. The probability estimation table includes, for each table index ST, the symbol generating probability for at least one of the major and minor symbols, the transition destination index NLPS when a minor symbol is generated, and the transition destination index NMPS when a major symbol is generated.

The predetermined decoding line is arranged in advance by the presently preferred decode processor. The decode processor defines the decoding line using the data stored in the area register. It divides the decoding line according to the input coded data and the symbol generating probability for that pixel data included in the table data of said probability estimator, computes the new decoding line, and replaces the data stored in said area register with the new length data A. Further, it outputs the symbol used for dividing said decoding line as the decoded pixel data and sends to said index generating means either input transition destination index NLPS or NMPS as the next transition destination index ST0 depending on whether said decoded pixel data is a major symbol or a minor symbol.

Further, as in the case of the encode processor discussed above, the preferred decode processor performs normalization operation when the length data A of the decoding line becomes less than the predetermined standard value, by shifting the bits of the data stored in the area and code registers so that the length data A becomes equal to or larger than the predetermined standard value. It receives the coded data having the same code length as that of the coded data overflowing from the code register and transfers it to the code register.

Thus, in addition to improved encoding or compression capabilities, the present invention allows for efficient decoding or decompressing of arithmetically encoded image data.

In particular, the present invention demonstrates the accurate, efficient decoding operation on the image data efficiently compressed by the image data encoder system because the symbol generating probability, one of the table data of the probability estimation table, is set to vary with the table index.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts: FIG. 1A is a block diagram illustrating the first preferable embodiment of the image data arithmetic encoder system according to the present invention;

FIG. 1B is a companion block diagram illustrating the first preferable embodiment of the image data arithmetic decoder system according to the present invention;

FIG. 2 shows the operation of the image data arithmetic encoder system of the embodiment shown in FIGS. 1A–1B;

FIG. 3 shows the data distributor according to embodiment shown in FIGS. 1A–1B;

FIG. 4 shows an example of the data processing performed with the image data arithmetic encoder system of the embodiment shown in FIGS. 1A–1B;

FIG. 5 is a more detailed block diagram of a dedicated arithmetic encoder according to the embodiment shown in FIGS. 1A–1B;

FIG. 6 is a flow chart showing the operation of the arithmetic encoder according to the embodiment shown in FIGS. 1A–1B;

FIG. 7 shows the Markov model used in the embodiment shown in FIGS. 1A–1B;

FIGS. 8A–B diagrammatically illustrates the theory of operation for both encoder and decoder systems according to the embodiment shown in FIGS. 1A–1B;

FIG. 9 is a more detailed block diagram of the arithmetic decoder according to the embodiment shown in FIGS. 1A–1B;

FIG. 10 is a flow chart showing the operation of the arithmetic decoder according to the embodiment shown in FIGS. 1A–1B;

FIGS. 11A–11G are timing diagrams of the input/output signals for the arithmetic encoder and the arithmetic decoder according to the embodiment shown in FIGS. 1A–1B;

FIGS. 12A–12B show an operational sequence operations of the individual arithmetic decoders according to the embodiment shown in FIGS. 1A–1B;

FIGS. 13A–13B show an alternative operational sequence of the individual arithmetic encoders and the arithmetic decoders according to the embodiment shown in FIGS. 1A–1B;

FIG. 14 is a block diagram of a pipelined arithmetic encoder according to the embodiment shown in FIGS. 1A–1B;

FIG. 15 is a sequence chart explaining the operation of the arithmetic pipelined encoder shown in FIG. 14;

FIG. 16 is a block diagram of a pipelined arithmetic decoder according to the embodiment shown in FIGS. 1A–1B;

FIG. 17 is a block diagram illustrating the second preferable embodiment of the image data arithmetic encoder system according to the present invention;

FIG. 18 is a block diagram illustrating the second preferable embodiment of the image data arithmetic decoder system according to the present invention;

FIG. 19 is a more detailed block diagram of the code integrator according to the embodiment shown in FIGS. 17 and 18;

FIG. 20 is a more detailed block diagram of the code buffer used for the code integrator according to the embodiment shown in FIGS. 17 and 18;

FIG. 21 is a flow chart showing the operation of the code integrator according to the embodiment shown in FIGS. 17 and 18;

FIG. 22 graphically describes an example of the operation of the code integrator according to the embodiment shown in FIGS. 17 and 18;

FIG. 23 is a more detailed block diagram of the coded data distributor used in the embodiment shown in FIGS. 17 and 18;

FIG. 24 is a flow chart showing the operation of the coded data distributor according to the embodiment shown in FIGS. 17 and 18;

FIG. 25 shows the operation of the coded data distributor according to the embodiment shown in FIGS. 17 and 18;

FIG. 26 is a block diagram of a code integrator used for the arithmetic encoder capable of pipelined operation according to the embodiment shown in FIGS. 17 and 18;

FIG. 27 is a block diagram of a coded data distributor used for the arithmetic decoder capable of pipelined operation according to the embodiment shown in FIGS. 17 and 18;

FIG. 28 illustrates a sample implementation of the presently preferred embodiments;

FIG. 29 shows a typical system in which the present invention may be applied; and FIGS. 30A–B respectively illustrate a prior art image data encoder and decoder systems.

DESCRIPTION OF THE PREFERRED EMBODIMENTS

Preferred embodiments according to the present invention will be described in detail below with reference to the drawings.

The components that have the same functions as those in the prior art are denoted with the same numerals, and their descriptions will not be given.

First Preferred Embodiment

FIG. 1A shows a first preferred embodiment of an arithmetic encoder system 2 according to the present invention. FIG. 1B illustrates a first preferred embodiment of an image data arithmetic decoder system 4 associated with system 2.

General Description of Image Data Arithmetic Encoding System 2

As shown in FIG. 1A, image data arithmetic encoder system 2 of this embodiment comprises an input interface 10; a data distributor 30; a plurality of arithmetic encoders 10-1, 10-2, 10-3, and 10-4; a plurality of output interfaces 14-1, 14-2, 14-3, and 14-4; a plurality of memory means 18-1, 18-2, 18-3, and 18-4; and a synchronizing controller 32.

Input interface 10 receives image data 100 from a memory 16 responding to the request of each arithmetic encoder 10-1, . . . , 10-4 and relays it to data distributor 30 as a data stream. Alternatively, though not shown in the figure, the input interface 10 could receive image data directly from a digitizer, uploaded from a remote site, through a network, or similar transfer system which affords digital data communications therewith.

The data for each pixel of image data 100 in the present embodiment does not directly represent a density of the pixel but must be converted to the density with reference to the color palette table which is output to a display device as multicolor data as is well-known in the art.

FIG. 2 shows an example of native or uncompressed image data 100, which is formatted with four bits per pixel to display 16 colors. Image data 100 is sent to data distributor 30 by four bits through input interface 10. If image data 100 is sent by four bit planes, input interface 10 may buffer the data, convert it to four bit serial data, and then send it to data distributor 30.

Data distributor 30 functions as data division means for dividing input image data 100 into a plurality of individual data streams 110-1, 110-2, . . . , 110-4 to output them to arithmetic encoders 10-1, 10-2, . . . , 10-4, respectively.

FIG. 3 illustrates a detailed structure of data distributor 30. Pixel data 100 is input to computer distributor 30 as four-bit serial data. Distributor 30 preferably divides the serial data into four planes of one bit each and outputs them to arithmetic encoders 10-1, 10-2, . . . , 10-4. As shown in FIG. 3, therefore, arithmetic encoders 10-1, 10-2, . . . , 10-4 receive, respectively, image data streams 110-1, 110-2, 110-4, each of which forms a plane of image data 100.

Arithmetic encoders 10-1, 10-2, . . . , 10-4 are controlled by a synchronizing controller 32 to perform parallel operations dictated by predetermined timing parameters. They encode individual image data streams 110-1, 110-2, . . . , 110-4 sent to them, and output individual encoded data streams 200-1, 200-2, . . . , 200-4, which, in turn, are respectively provided to memories 18-1, 18-2, . . . , 18-4, in sequence, through output interfaces 14-1, 14-2, . . . , 14-4 and are stored therein.

Thus, memories 18-1, 18-2, . . . , 18-4 store encoded data stream 200-1, 200-2, . . . , 200-4, respectively, that were created by encoding image data 100 shown in FIG. 3. Although in this embodiment, 4 memories are shown, the actual number of memories is not determinative to practicing the invention as long as there is sufficient storage space provided to retain (at least temporarily) individual encoded data streams 200-1, . . . , 200-4.

Arithmetic encoder system 2 of the present embodiment divides image data 100 into four bit planes which are encoded in parallel by arithmetic encoders 10-1, 10-2, . . . , 10-4. Thus, this scheme increases the speed of encoding by a factor of four over the conventional methods encoding the same type of image data.

General Description of Image Data Arithmetic Decoder System 4

FIG. 1B shows an arithmetic decoder system 4 of the present embodiment, having four arithmetic decoders corresponding to the four encoders of arithmetic encoder system 2.

Arithmetic Decoder System 4 comprises four memory means 18-1, 18-2, . . . , 18-4 (not shown); input interfaces 20-1, 20-2, . . . , 20-4; and arithmetic decoders 22-1, 222, . . . , 22-4.

Memory means 18-1, 18-2, . . . , 18-4 mentioned hereinabove contains encoded data streams 200-1, 200-2, . . . , 200-4 produced by the arithmetic encoder system 2 shown in FIG. 1A.

Input interfaces 20-1, 20-2, . . . , 20-4, respectively, read encoded data streams 200-1, 200-2, . . . , 200-4 from memory means 18-1, 18-2, . . . , 18-4 in response to commands issued by arithmetic decoders 22-1, 22-2, . . . , 22-4 and relays the received information to them. Synchronizing controller 32 controls arithmetic encoders 22-1, 22-2, . . . , 22-4 so that they perform a parallel operation in the correct timing.

Arithmetic decoders 22-1, 22-2, . . . , 22-4 decode, respectively, incoming encoded data streams 200-1, 200-2, . . . , 200-4 following the exactly reversed procedures of those for corresponding arithmetic encoders 10-1, 10-2, . . . , 10-4 and output to data multiplexer 34 resultant image data streams 110-1, 110-2, . . . , 110-4, each of which forming a bit plane of the image.

Data multiplexer 34 functions as data combiner. The data flow is opposite to that of data distributor 30 in FIG. 4. The data streams 110-1, 110-2, . . . , 110-4 are combined into one image data stream 100 and sent out to a memory or transfer means 26 through an output interface 24.

When decoding is performed not by pixel, but by bit plane, output interface 24 may be configured to buffer and rearrange the data. In this way the original four-bit image data 100 having 16 colors shown in FIG. 2, is restored and is input to a memory or transfer means 26. Therefore, if a video RAM is used for memory 26, the video RAM stores image data 100 accurately restored for display.

Since image data arithmetic decoder system 4 of the present embodiment decodes four encoded data streams in parallel, it can generate image data four times as fast as the conventional system compared to conventional decoders operating on the same type of image data.

In the present embodiment both arithmetic encoder system 2 and arithmetic decoder system 4 are assumed to perform parallel operations in four paths. The number of paths in an actual system, however, can be preferably any number between 2 and 32 inclusive, preferably between 2 and 8 inclusive depending upon operation speed and hardware balance. In theory, the actual number of paths could be $2^n$ wherein n is an integer $\geq 0$. However, it is Applicant's view that extending the paths beyond 32 adds little in terms of speed improvement while greatly complicating the encoder and decoder systems.

A particularly preferable system is a special combination of systems 2 and 4 in the present embodiment wherein arithmetic decoder system 4 includes a plurality of matched semiconductor memories functioning as memories 18-1, . . . , 18-4.

In the present embodiment the image data was divided into a plurality of image data streams in pixel unit. The present invention, of course, is not so limited, and conveniently allows the data to be divided in other ways. An example is shown in FIG. 4, where the image data 100 forming one image frame is divided into a plurality of real image data 110-1, 110-2, . . . , 110-4 organized as frame bands.

Arithmetic Encoder and Arithmetic Decoder

Arithmetic encoder 10 and arithmetic decoder 22, used in systems 2 and 4, respectively, will be described in more detail hereinbelow.

Since a general technique of arithmetic encoding is given in Binary Image Data Encoding Standard JBIG (International Standard ISO/IEC 11544), pages 26–44 and 44–50, only a brief description of the technique is given here.

Arithmetic Encoder

FIG. 5 is an example of arithmetic encoder 10 used in system 2 of the first preferred embodiment.

Each arithmetic encoder 10-x comprises a delay unit 40, a status register 42, a probability estimator 44, a processor 46, an area register 48, and a code register 50.

Area register 48 and code register 50 are configured as conventional registers for storing binary data.

FIG. 8A illustrates the general algorithm for the encoding process used in the preferred embodiments. First, as shown at column(a) in 8A, one defines an initial encoding line A that spans from 0 to 1.0. The length A of the encoding line is stored in area register 48 as a real number; the position data of a point on the encoding line, the position data C of the minimal point of the encoding line in this case, is stored in code register 50 as a binary coded data C. Therefore, the length data A and position data C, stored in registers 48 and 50, respectively, define the encoding line shown in (a) of FIG. 8A.

Processor 46 obtains the generating probabilities for the symbols 0 and 1 as described below, depending on the minor symbol generating probability LSZ provided by probability estimator 44, and then divides the encoding line A into the areas $A_0$ and $A_1$ that correspond to the symbols 0 and 1, respectively. Assume that a pixel data or "Pix" of a symbol 0 is input and the symbol 0 is encoded. Then, the area $A_0$ of the divided encoding line will be a new encoding line as shown in column (b) of FIG. 8A. The length A' of the new encoding line and the position data C of the minimal point replace the old values in registers 48 and 50, respectively.

When the next pixel data Pix is input, processor 46 divides the encoding line into the areas $A_1$ and $A_1'$, depending on the symbol generating probability LSZ provided by probability estimator 44. This situation is also shown in column (b) of FIG. 8A.

Assume that the input pixel data Pix is a symbol 0. Then, the area $A_0'$ associated with the symbol 0 will be a new encoding line as shown in column (c) of FIG. 8A. The length A" of the new encoding line and the position data C are written in registers 48 and 50, respectively, to replace the old values.

Next, if a pixel data Pix of a symbol 1 is input, the area $A_1"$ associated with the symbol 1 will become a new encoding line as shown in column (d) in FIG. 8A. The length A'" of the new encoding line and the position data C of the minimal point are written to register 48 and 50, respectively. This progresses until the stream is completely encoded.

Thus, the position data C input in code register 50 becomes the encoded data value representing the input symbols 0, 0, and 1.

Each process shortens the length of the encoding line and hence decoding many symbols decreases the length of the encoding line considerably. The high precision of multiple digits, therefore, is required to express the encoded data. Since the computer has a limited precision in computation, one can truncate the high-order digits unnecessary for subsequent calculation and exclude them from future calculations in order to improve their precision. In taking the above into consideration, the encoding processes of the present embodiment need include only bit shift, addition, and subtraction capabilities.

More specifically, when the length A of the encoding line stored in area register 48 becomes less than the predetermined standard value (0.5 in the present embodiment), processor 46 detects this situation and performs the normalization operation by which processor 46 shifts the bits of the data stored in registers 48 and 50 so that the length A becomes greater than the predetermined standard value (0.5 in the present embodiment). The data of the high-order bits that overflow from code register 50 and the number of those bits are output as the coded data and code length data, respectively. This scheme allows registers 48 and 50 to encode efficiently a series of input symbols using simple operations even if registers 48 and 50 have registers with a limited number of digits.

If registers 48 and 50 are 16 bit registers, the initial value of the encoding line A (as shown in column (a) of FIG. 8A) to be set in area register 48 is 10000h in the hexadecimal notation. The data stored in register 48 and 50 is expressed in the hexadecimal notation ("h" means the hexadecimal notation). The bit shift takes place when the value of register 48 becomes less than 8000h which is less than half of the initial value.

An important point of the encoding processes is how to determine the symbol generating probability LSZ. If the minor symbol generating probability which is low is LSZ, the major symbol generating probability which is high will be (A-LSZ). Various methods have used different values for the aforementioned generating probabilities. The present embodiment uses the generating probabilities as set out in the probability estimation Table 1 hereinbelow. This probability estimation table is arranged with the index ST, which ranges from 0 to 112. For each index ST, the table shows the table data, including a minor symbol generating probability LSZ, a transition destination index NLPS when a minor symbol is generated, a transition destination index NMPS when a major symbol is generated and a bit shift has taken place, and SWITCH that indicates the exchange of the pixel values that represent minor and major symbols.

Selection of the generating probability LSZ in the probability estimation table (Table 1) is determined by the index ST that has the initial value of 0. Renewal of the index ST takes place either (1) when a minor symbol is generated or (2) when a bit shift occurs after successive generations of major symbols. The renewed index ST is either NLPS for case (1) or NMPS for case (2). For example, if the present ST is 10, that is, the minor symbol generating probability is 000Dh and if a minor symbol is generated, ST is updated to 35 (NLPS) for the next data, and the minor symbol generating probability will be 002Ch. Further, if the ST is 10 and the bit shift takes place after successive generations of major symbols because the value of encoding line A becomes less than 8000h (less than ½ of the initial value), ST is renewed to 11 (NMPS), and the minor symbol generating probability will be 0006h.

The probability estimation table shown in Table 1 is constructed so that, when the initial state undergoes successive changes, the generating probability for a minor symbol varies rapidly in order to follow a local change of the image data.

Further, when the image data Pix to be encoded makes a transition from an area including more 0s than 1s to an area including more is than 0s, the pixel values, meaning minor and major symbols, must be exchanged. Table 1 is constructed so that, when a minor symbol is generated for ST having a SWITCH of 1, the pixel values, meaning major and minor symbols, are exchanged. In this case processor 46 produces data MPSO indicating a major symbol.

FIG. 6 is a flow chart showing the operations of the arithmetic encoder in FIG. 5. First, arithmetic encoder 10 initializes the data of delay unit 40, status register 42, area register 48, and code register 50 at Step S10. The initial values for registers 48 and 50 are the length A of the encoding line of FIG. 8A and the position data C=0 of its lowest position, respectively.

When an image data stream is provided, one-bit data Pix for each pixel is introduced to both delay unit 40 and processor 46.

Delay unit 40 functions as context generating means and includes a line buffer to store image data for one or more scan lines. Delay unit 40 stores input image data by scan line. When the data Pix of a pixel X is input as shown in FIG. 7, the delay unit creates the well-known Markov model with the neighbor pixels a, b, . . . , f as reference pixels and outputs to status register 42 the data of the reference pixels defined with the Markov model as a context CX=a, b, . . . , f. The context CX will be a pointer of status register 42. These steps are performed in step S12. Control thereafter passes to step S14.

At step S14, Status register 42 receives the transition destination index ST0 and the major symbol NMPS0 from processor 46 in a Step S28 to be described below. Status register 42 stores the predetermined two-dimensional table data of the optimal transition destination index data STi for given two-dimensional input information CX and ST0. The obtained optimal transition destination index STi is sent out to probability estimator 44. Control thereafter passes to step S16, in which status register 42 outputs also to processor 46 the minor symbol data MPSi that indicates which digit 0 or 1 of the input data Pix represents the minor symbol.

Control thereafter passes to step S18. At this step, probability estimator 44 stores the probability estimation table entry shown in Table 1 below. It outputs to processor 46 the table data for the index ST according to the optimal transition destination index STi provided by status register 42. That is, it outputs to processor 46 a minor symbol generating probability LSZ; NLPS and NMPS, transition destination indices when the major and minor symbols respectively are generated; and SWITCH.

Every time a pixel data PIX is input, processor 46 reads the data A and C from area register 48 and code register 50 to define the new encoding line shown in FIG. 8A, and step S20 of FIG. 6. Then, it divides the encoding line into the respective generating areas A0 and A1 for the symbols 0 and 1 according to the symbol generating probability LSZ provided by probability estimator 44 (steps S22).

In steps S24–S26, the processor then determines whether the input pixel data PIX is either symbol 0 or 1, defines the divided area corresponding to the determined symbol to be a new encoding line, and updates the length data A and the position data C in registers 48 and 50, respectively. More specifically, when the pixel data is 0, the divided area $A_0$ associated with the symbol 0 is defined as a new encoding line; when the pixel data is 1, the divided area $A_1$ associated with the symbol 1 is defined as a new encoding line; then, the length data A' and the position data C of the new encoding line are stored in registers 48 and 50.

Also, at step S26, the Processor 46 of the present embodiment decides whether the length data A of the divided area stored in area register 48 is greater or less than the standard value 0.5. If it decides that the length data A is greater than the standard value 0.5, it outputs only the code length data that indicates that the number of bits of the code length data is zero. If the length data A is less than the standard value 0.5, it performs the normalization process by shifting the bits of the data stored in area register 48 and code register 50 in order to make the length data A greater than the standard value 0.5. The bits overflowing from code register 50 in the normalization process are output as the encoded data. The code length data representing the number of the output bits is output at the same time.

Thus, processor 46 outputs signals, including the code and code length data, every time a pixel data Pix is received. Further, if necessary, processor 46 outputs a carry signal that indicates carry for the encoded data.

Control thereafter passes to step S28. At step S28, processor 46 determines whether an input pixel data Pix is a major or minor symbol. If the input is a minor symbol, it outputs the table data NLPS for a transition destination index ST0 to status register 46; if the input is a major symbol, however, it outputs the table data NMPS for a transition destination index ST0. After determining whether the major symbol corresponding to the context CX is 0 or 1 based on input MPSi and SWITCH data, Processor 46 outputs the data for MPS0 to status register 42.

Thereafter, arithmetic encoder 10 of the present embodiment repeats the aforementioned series of processes (Step S12–Step S28) for all of the pixel data Pix (symbol), forming an image data stream, and ends the encoding process when all the data is processed (Step S30 determination is YES).

FIGS. 11A–D shows a timing diagram for the data produced from arithmetic encoder 10 of the present embodiment. The process cycle S in the figure denotes one of the series of the processes D, S, P, and Q shown in FIG. 6 which arithmetic encoder 10 executes. Arithmetic encoder 10 outputs an enable signal EN that effectively enables the outputs from processor 46 for a predetermined short period while the process Q is carried out and, during that period, sends out Code as the coded data, its code length data, and carry data if necessary. That is, while the enable signal EN is active, it outputs a series of signals (Code, code length, and carry) provided by processor 46 as the valid data. Therefore, when the normalization process is not performed for the length data A in area register 48, a carry signal is not output from register 50 and hence the code length data for 0 bit is sent out to indicate that there is no Code output. When the normalization process is performed, however, arithmetic encoder 10 outputs the Code data overflowing from code register 50 as the encoded data together with the code length data indicating its bit length.

Table 2A below describes an example of encoding input data by means of arithmetic encoder 10 of the present embodiment. Assume that a series of symbols "001111" is input to arithmetic encoder 10 as an image data stream. For the encoding of subtraction type, if the generating probability for the minor symbol is set close to 0.5, the generating probabilities allocated to the major symbol and the minor symbol may be reversed (the generating probability of the major symbol < the generating probability of the minor symbol). A QM coder adopted in JBIG (Joint Bilevel Image Group), when the generating probabilities are reversed, performs encoding by exchanging the interpretations for the major and minor symbols to prevent degradation of the encoding efficiency. This is called the major symbol/minor symbol conditional exchange (hereinafter referred to as the conditional exchange).

The initial values for the minor and major symbols are set at 1 (black) and 0 (white), respectively as shown in the first row in Table 2A. When encoding of the first major symbol is completed, the generating probabilities for the major and minor symbols are reversed (SWITCH=1). Therefore, the second symbol is encoded after the conditional exchange, indicated as rows 2 and 3, is carried out. Because of the conditional exchange, encoding of the major symbol 0 is equivalent with that of the minor symbol on the encoding line of the arithmetic encoding described in row 3. Therefore, the value for the major symbol is added to the value of register 50. This means that there has been a change in the encoding line to be used in the next and subsequent encoding steps. After encoding the second symbol, the value A is less than 8000h and the bit shift takes place, as indicated in row 4 of Table 2A. The bit shift is carried out for both A and C. The data overflowing from the term C is output as the encoded data.

When a bit shift occurs, ST changes and the minor symbol generating probability changes also. In this example, the ST was 0 and the minor symbol generating probability was 5A1Dh before the change, but after the change, due to the bit shift of the major symbol, the ST and the minor symbol generating probability change to 1 and 2586h, respectively.

The next symbol to encode is the major symbol 1, as shown in row 5 of Table 2A. In encoding the major symbol, the major symbol generating probability is added to the value C. Encoding this makes the value A less than 8000h and induces a bit shift again. This time, since two bit shifts are required to make the value A larger than 8000h, each term also undergoes two bit shifts. Since the bit shifts occur because of the major symbol with the conditional exchange, the ST is updated to 14 and the value for the minor symbol becomes 5A7Fh, as indicated in row 6.

Next, the minor symbol is encoded again with the conditional exchange, occurring as shown in rows 6 and 7 of Table 2A. The encoding makes the value A less than 8000h and hence induces bit shifts in row 8. Now, since SWITCH is 1 for ST=14 and the bit shifts occurred on encoding the minor symbol, the symbols for the minor and major symbols are reversed so that 0 corresponds to the minor symbol and 1, the major symbol.

The two 1s, now the major symbols, that follow are encoded and the whole encoding process ends. The encoded data obtained from the series of the symbols 001111 is the sum of Q and C, which is 10010011001001010000000.

Arithmetic Decoder

FIG. 9 shows an example of arithmetic decoder 22—used for arithmetic decoder system 4. The components, equivalent to those used for the arithmetic encoder in FIG. 5, are given the same numerals and their descriptions need not be provided.

Arithmetic decoder 22-x of the present embodiment comprises delay unit 40, status register 42, probability estimator 44, processor 52, area register 48, and code register.

When a coded data stream 200 is input, processor 52 decodes the coded data stream to output pixel data Pix using the algorithm that is the exact reverse of that used for arithmetic encoder 10 shown in FIG. 5.

FIG. 8B shows a general algorithm for the decoding process. First, one defines an initial decoding line A that runs from 0 to 1.0. The length A of the decoding line is stored in area register 48 as a real number. In the decoding process the position data of the minimal point of the decoding line is always defined as 0. Therefore, the length data A stored in register 48 defines the decoding lines as shown in cols. (a), (b) or (c), or (d) of FIG. 8B.

When coded data to be decoded is received, the data is latched at code register 50. Then a series of decoding processes, based on the values of the latched data to be decoded, start.

First, processor 46 obtains the generating probabilities $A_0$ and $A_1$ for the symbols 0 and 1, respectively, according to the generating probability LSZ for the minor symbol provided by probability estimator 44 as described below and divides the decoding line. It then determines in which divided area, $A_0$ or $A_1$, the coded data C falls. Consider the decoding line shown in column (a) of FIG. 8B as an example. If the data C is determined to fall in the Ao area, a symbol 0 is output as the decoded pixel data Pix. The portion $A_0$ of the decoding line (a) will be the new decoding line and register 48 is updated with the length A' of this line.

Next, the decoding line A' shown in column (b) of FIG. 8B is divided into two areas $A_0'$ and $A_1'$ depending upon the generating probabilities of the symbols 0 and 1. The processor decides in which area the coded data C falls and outputs a decoded pixel data Pix depending on the result of the decision. The next decoding line is defined in the same way. If the coded data C falls in the $A_0'$ area in the decoding line, as shown in column (b) of FIG. 8B, a symbol 0 is output for the decoded pixel data Pix. The divided area $A_0'$ becomes the next decoding line A" as shown in column (c) of FIG. 8B.

Similarly, the processor determines in which divided area $A_0''$ or $A_1''$ the next encoded data C falls. This time, suppose that the data C falls in the area $A_1''$. Then, a symbol 1 is output as the decoded pixel data Pix and the next decoding line is defined as shown in column (d) of FIG. 8B. The value C of the encoded data in code register 50 is updated with $(C-A_0'')$ to reflect the shift of the decoding line.

Thus, the coded data input to code register 50 through processor 52 is decoded and output as the pixel data 0, 0, 1, . . .

However, this technique of decoding of the stored coded data requires code register 50 to have the same number of registers as the coded data bits, which is not practical. To solve this problem the same method as is used for arithmetic encoder 12 is adopted. That is, the decoding is performed by code register 50 accepting only the necessary digits of the coded data and removing the unnecessary digits for the calculation. This method allows the decoding to be performed by a computer with limited accuracy. In taking the above into consideration, the decoding process of the present embodiment includes only bit shift, addition, and subtraction operations.

More specifically, when the length A of the decoding line stored in register 48 becomes less than the predetermined standard value (0.5 in the present embodiment), processor 46 detects this situation and performs the normalization operation by which processor 46 shifts the bits of the data stored in registers 48 and 50 so that the length A becomes greater than the predetermined standard value (0.5 in the present embodiment). The number of the bits that overflow from code register 50 is called the code length. The decoder is constructed so that code register 50 reads the next coded data by the same code length. For example, assume that register 50 comprises a 16 bit register and that three high-order digit bits overflow due to the normalization process. Then, there is a vacancy of three low-order digit bits. The code register reads the following three bits of the coded data and stores them at the bottom of the register. This scheme allows register 50 to decode efficiently a data stream using simple operations even if the register has a smaller number of digits than the data stream.

FIG. 10 is a flow chart depicting the operations of arithmetic decoder 22.

Control begins at step S40, in which arithmetic decoder 22 starts the operation initializing delay unit 40, status register 42, area register 48, and code register 50. Typically, delay unit 40 is initialized with 0 although there are many different ways to initialize it. Area register 48 is initialized with 10000h, which specifies the length A of the decoding line shown in column (a) of FIG. 8B.

Thereafter, control passes to step S42. At this step, when coded data 200 of the predetermined code length is input to processor 52, the data is transferred to code register 50 in sequence.

Then, at step S44, delay unit 40 determines the context CX for the next pixel to be decoded, according to the decoded pixel data stream produced by processor 52, and outputs it to status register 42.

Next, at steps S46 and S48, status register 42 computes the optimal transition destination index STi based on the context CX as well as the data ST0 and MPS0 provided by processor 52 and outputs the STi to probability estimator 44. Status register 42 also outputs MPSi to processor 52. Control thereafter passes to step S50.

At step S50, the probability estimator 44 finds the table data of Table 1, corresponding to the input optimal transition destination index STi, and sends out the table data to processor 52.

Next, at step S52, processor 52 reads the data from registers 48 and 50. Using the length data A read from area register 48, the processor defines the decoding line in column (a) of FIG. 8B. Defining the decoding line is different from defining the encoding line as described above in that the position of the minimal point for the decoding line is always set at 0. This means that every decoding line always has the position data of its minimal point at 0. Therefore, defining the decoding line does not require the data of code register 50.

Then, in steps S54 and S56 in sequence, the defined decoding line is divided into the generating areas $A_0$ and $A_1$ associated with the symbols 0 and 1, respectively, using the symbol generating probability LSZ obtained from probability estimator 44. Next, the processor determines in which divided area, $A_0$ or $A_1$, the coded data C from code register 50 falls. If it belongs to $A_0$, a symbol 0 is output from processor 50 as decoded pixel data; if it belongs to $A_1$, a symbol 1 is output.

Control then passes to step S58. At this step, the processor defines the divided area to which the coded data C belongs as the next decoding line and updates area register 48 with the length data and, if necessary, code register 50 also. For example, suppose the present decoding line is the decoding line shown in column (b) of FIG. 8B. If the coded data C of code register 50 falls in the divided area $A_0$, the length data of the divided area $A_0$ is considered to be the length of the next decoding line $A^1$ and is stored in area register 48. In this case there is no update on code register 50. The decoding line for the next decoding cycle is shown in column (c) of FIG. 8B. If the coded data C of code register 50 falls in the divided area $A_1$ in the next decoding cycle, processor 52 stores the length data of the $A_1$ in area register 48 as the length data of the next decoding line A" and replaces the coded data C of code register 50 with the value of (C-$A_0$'). Thus, the same process is repeated in order to obtain the next decoding line.

Then, in step S60, depending on whether or not the coded data falls in $A_0$ or $A_1$ in Steps S54 and S56, that is, whether it falls in the major or minor symbol area, processor 52 sends out either NLPS or NMPS as the transition destination index ST0 to status register 46.

Arithmetic decoder 12 of the present embodiment performs the normalization operation, as arithmetic encoder 10 does, based on the length data A of area register 48 in carrying out Step 58. In the normalization operation, when the length data A of area register 48 becomes equal to or less than the predetermined standard value (less than one half of the initial value), the decoder shifts the bits of the data of registers 48 and 50 so that the data are equal to or greater than the standard value (0.5). After the normalization, a request signal Req for requesting the next coded data is sent to input interface 20 and outputs the data indicating the code length. When the normalization is not carried out, a request signal is sent out according to the predetermined timing together with the code length data indicating 0 bit. After finishing Step 60, arithmetic encoder 22 of the present embodiment determines whether the normalization operation has been carried out in Step 58 or not (Step 62). If the normalization has not been carried out, the operation goes back to Step 44 and repeats the processes of Step 44 through Step 62 until the normalization takes place.

If it is determined that the normalization has taken place in Step 62, the operation goes to Step 64 and then back to Step 42 to read coded data having the code length provided in Step 58 and writes them in order on the low-order digits of code register 50. For example, assume that the data a, b, c, and d are stored in code register 50 and assume also that the data a and b overflow to be output and that the data e and f are read. Then, the data d and e are read on the lowest digits with the data d read first. As a result the register stores the data, c, d, e, and f in that order.

A series of steps from Step S44 to Step S62 are repeated based on the stored coded data until the next normalization takes place and then a decoded pixel data is output. Then, control passes back to Step S42 for the next set of code data and the processor reiterates. When there are no more symbols to decode (Step 64), the operation ends.

FIGS. 11E–G illustrates a timing diagram for the data input to and data output from processor 52 of the present embodiment. When the request signal and the code length data are output on step S58 of the process Q' shown in FIG. 10, the coded data having the required code length is input on Step S42 of the next cycle. The code length of 0 indicates that coded data is not read in that cycle.

Thus, processor 52 reads the coded data in sequence and decodes them into pixel data in order.

Table 2B below shows an example of the decoding operation performed by arithmetic decoder 22 of the present embodiment. In this example it decodes the coded data of 1001001100100101000000 which was obtained from the example shown in Table 2A. The initial register setting for decoding is almost the same as that for encoding except for the register for the value C, which reads the coded data from the start and is 9325h in this case, indicated on row 1 of the table. The decoder determines whether the value C of register 50 is greater or lesser than the major symbol (A-LSZ). In this example, since the value C is less than the major symbol, the decoder outputs a major symbol 0 for decoded data and stores the value of the major symbol in register 48 for the value A, indicated in row 2. In decoding the next symbol it performs the major symbol/minor symbol conditional exchange and then compares the result with the value C of register 50. Because the value C of register 50 is greater, it outputs a minor symbol for decoded data (a symbol 0, actually a major symbol because the conditional exchange has occurred.) and stores the value of the minor symbol in register 48, as shown in row 3 of Table 2B. The value of the major symbol is subtracted from the value C of register 50. Then, the value A of register 48 becomes less than 8000h, and bit shifts take place for every term. Since the ST is also updated with the bit shifts, the value for the minor symbol becomes 2586h, as shown in row 4 of the table.

In this situation, the value C of register 50 is greater than the value of the major symbol and hence the next decoded symbol is a minor symbol 1. The value A of register 48 becomes the value of a minor symbol. The value C of register 50 is subtracted by the value of the major symbol (5). Now, since the value A of register 48 is less than 8000h, bit shifts take place again. At the same time ST is changed to 14, as depicted in row 6 of Table 2B.

In the next decoding, since the value C of register 50 becomes less than the major symbol value after performing the conditional exchange, a major symbol is output for the decoded data (a symbol 1, actually a minor symbol because the conditional exchange has occurred) and stores the value of the minor symbol in register 48. Then the bit shifts take place. Now, since the value of SWITCH is 1 for ST=14 and since the minor symbol has been output for the decoded signal, the values of the major and minor symbols are exchanged and the operation proceeds to the next decoding.

After producing two more major symbols 1 for the decoded data, the decoder completes decoding of all the coded data and ends the decoding operation.

Thus, the present embodiment performs data compression and decoding using arithmetic encoder 10 shown in FIG. 5 and arithmetic decoder 22 shown in FIG. 9 by means of their respectively reversed algorithms for encoding pixel data and for decoding coded data.

The Second Embodiment

In the first preferable embodiment described above, arithmetic encoder system 2 creates four coded data streams 200-1, 200-2, 200-3, and 200-4, which are stored in memories 18-1, 18-2, 18-3, and 18-4, respectively; arithmetic decoder system 4 receives the coded data streams 200-1, 200-2, 200-3, and 200-4 from memory means 18-1, 18-2, 18-3, and 18-4, respectively, to decode them. This scheme is appropriate to such systems as 2 or 4, which have a plurality of segmentable memories. It is not appropriate, however, either in the case where coded data must be efficiently stored in a single memory means or in the case where coded data is transmitted through a transmission line. In the present preferred embodiment, the coded data streams 200-1, 200-2, . . . , 200-4, created with arithmetic encoder 2, are combined into an integrated coded data stream and are then either stored in a memory means or transferred through a transfer medium. Arithmetic decoder system 4 decomposes the integrated coded data stream into multiple coded data streams which are decoded in parallel to obtain pixel data. This second preferable embodiment is described in detail below.

The components equivalent to those used for the first embodiment are given the same numerals and their descriptions are not further provided.

FIG. 17 shows arithmetic encoder system 2 of the present embodiment. The distinguishing point with arithmetic encoder system 2 of the present embodiment is that coded data streams of 200-1, 200-2, . . . , 200-4 created with arithmetic encoder 10-1, 10-2, . . . , 10-4, respectively, are combined into an integrated coded data stream 210 in accordance with a set of procedures with a code integrator 36 functioning as a data combiner; and the integrated coded data stream is output to a memory or transfer means 18 through output interface 14. FIG. 18 shows an arithmetic decoder system 4 configured to operate with the arithmetic encoder system shown in FIG. 17.

In decoder system 4 of the present embodiment, coded data distributor 38, functioning as a data distributing means, decomposes an integrated coded data stream 210 provided by a memory or transfer device through input interface 10 into multiple coded data streams 200-1, 200-2, . . . , 200-4 in accordance with a set of procedures; and it sends out the multiple coded data streams to corresponding arithmetic decoders 22-1, 22-2, . . . , 22-4.

In the case where integrated coded data stream 210 is stored in memory 18, arithmetic encoder system 2 and arithmetic decoder system 4 configured in this way facilitate the address allocation for the memory means and enable the data storage to be efficient. For the case where integrated coded data stream 210 is transferred through a transfer means 18, the data transfer becomes easy because the data is serialized.

Another characteristic of the present system is that integrated coded data stream 210, created from coded data streams 200-1, 200-2, . . . , 200-4 at code integrator 36 of arithmetic encoder system 2 in accordance with a set of procedures, need not include the special data that might be required for the decomposition process in decoding. The integrated coded data stream is decomposed into individual coded data streams 110-1, 110-2, . . . , 110-4 at coded data distributor 38 of arithmetic decoder system 4 simply by using the reverse procedures. This prevents a reduction in data compression efficiency because the special data for decomposing need not to be introduced to integrated coded data stream 210.

Arithmetic decoder system 4, shown in FIG. 18, is configured so that it operates completely in reverse for arithmetic encoder system 2 shown in FIG. 17. Coded data streams 200-1, 200-2, . . . , 200-4 are combined into integrated coded data stream 210 under the predetermined rules, which is then stored at memory 18. When integrated coded data stream 210, stored in memory 18, is introduced to coded data distributor 38 of arithmetic decoder system 4 through input interface 10, the decoder system simply distributes the coded data of the requested code lengths responding to the request signals Req from individual arithmetic decoders 22-1, 22-2, . . . , 22-4. Thus, the decoder system decomposes integrated coded data stream 210 and outputs multiple coded data streams 110-1, 110-2, . . . , 110-4 to individual arithmetic decoders 22-1, 22-2, . . . , 22-4, respectively. Since the special data for the decomposing process is not needed in integrated coded data stream 210, the data compression efficiency is not reduced.

The operation of the present embodiment is described in greater detail hereinbelow.

Code Integrator 36

Arithmetic encoder 10 and arithmetic decoder 22 used in systems 2 and 4 of the present embodiment have the same general structures as shown in FIG. 5 and 9, respectively.

Coded data streams 200-1, 200-2, . . . , 200-4, produced by respective arithmetic encoder 10-1, 10-2, . . . , 10-4 of arithmetic encoder system 2, have indefinite data lengths. Almost any data compression technique, including arithmetic encoding, makes the data length indefinite.

Therefore, when combining multiple coded data streams having indefinite data lengths 200-1, 200-2, . . . , 200-4 that have been encoded with arithmetic encoder 10-1, 10-2, . . . , 10-4, respectively, by means of code integrator 36 to a single integrated coded data stream, certain rules must be applied to this combining process. Otherwise, upon decoding the coded data it would be impossible to separate them properly.

Coded data is produced in every process cycle shown in FIG. 6 (Step S12—S30) from arithmetic encoder 10-1, 10-2, ..., or 10-4. In the present embodiment, combining of the coded data having indefinite data length into a single bit stream is performed in the fixed order (for example, in the order of 10-1, 10-2, ..., and 10-4).

However, such a simple process as the combination of the coded data has the problem of carry transfer.

That is, there is a carry transfer problem for arithmetic encoder 10. When a carry signal is output from arithmetic encoder 10 as a result of calculation and if there are "1"s consecutively in the coded data stream that has already been output, the carry transfer occurs, and the coded data stream that has already been output must be modified. Therefore, simple combination of data streams 200-1, 200-2, ..., 200-4 cannot properly treat the carry transfer.

System 2 of the present embodiment includes a code integrator 36 having a structure shown in FIG. 19. Code integrator 36 comprises a plurality of code buffers 62-1, 62-2, ..., 62-4 which are provided to receive data from individual arithmetic encoders 10-1, 10-2, ..., 10-4, respectively; a buffer controller 60; and Selector 64.

Arithmetic encoders 10-1, 10-2, ..., 10-4 output to code buffers 62-1, 62-2, ..., 62-4, respectively, the signals including coded data stream 200, carry signal 202, code length data 204, and the enable signal shown in the timing diagrams of FIG. 11A.

Each of code buffers 62-1, 62-2, ..., 62-4 stores each of respective coded data streams 200-1, 200-2, ..., 200-4 sent from respective arithmetic encoder 10-1, 10-2, ..., 10-4, while the enable signal EN is active, treating the carry transfer based on carry signals 202-1, 202-2, ..., 202-4. In other words, code buffers 62-1, 62-2, ..., 62-4 temporarily store incoming coded data streams 200-1, 200-2, ..., 200-4, respectively, and perform the carry transfer on stored coded data stream 200 when it receives active carry signal 202 from corresponding arithmetic encoder 10.

Buffer controller 60 determines whether or not there is a possibility for the carry transfer within code buffers 62-1, 62-2, ..., 62-4 based on the data stored in each buffer. If it finds only a small possibility for the carry transfer in each buffer, it causes the stored coded data to be output to selector 64 according to the prescribed rules from buffers 62-1, 62-2, ..., 62-4 in that order.

Selector 64 combines the incoming coded data serially into a single integrated coded data stream 210 and then sends it out.

FIG. 20 shows a configuration of code buffer 62.

Code buffer 62 of the present embodiment comprises a flow controller 70, an input controller 72, an output controller 74, a code length table 76, a code buffer memory 78, and a carry processor 79.

Code buffer 62 receives an enable signal EN, coded data stream 200, carry signal 202, and code length data 204 from the respective arithmetic encoder 10 in the timing shown in FIG. 11A.

Code buffer memory 78 and code length memory 76 are formed basically as FIFO (First In First Out) type memories. Coded data 200 provided every process cycle from arithmetic encoder 10 is written to code buffer memory 78 and, at the same time, code length data 204 is written to code length table 76.

When active carry signal 202 is sent from arithmetic encoder 10, carry processor 79 performs the carry transfer, wherein carry processor 79 reverses a predetermined number of bits of the code buffer memory 78. Code buffer memory 78 must have a large enough number of bits to cover the carry transfer. The needed number of bits depends upon the images to process. In the present embodiment 200 bits are provided, although an arbitrary number between 100 and 1000 bits will suffice for most applications.

Flow controller 70 controls the amount of coded data to be written in code buffer memory 78. More specifically, by means of input controller 72 and output controller 74, it maintains the amount of data in code buffer memory 78 at approximately 200 bits.

FIG. 21 is a flow chart showing the operation of code integrator 36 as shown in FIG. 19, while FIG. 22 demonstrates its operation of data combination.

Turning to FIG. 21, first, in steps S70 and S72, the initialization is performed to set m=0 and n=0. The "m" variable indicates the current buffer and the "n" variable indicates current encoded bit. Code buffers 62-1, 62-2, ..., 62-4 read coded data streams 200-1, 200-2, ..., 200-4, respectively, in that order, and selector 64 creates an integrated coded data stream 210 through execution of looped Steps S76–S80 and S72–S84. These operations are performed repeatedly.

For example, the code length x for the coded data is read from code length table 76 of code buffer 62. Assuming the code length X to be read now is X=1, one bit of the coded data a0 is read from code buffer memory 78-1 (steps S76, S78, and S80).

M is set at 1 in step S82 and the data reading for code buffer 62-2 starts (steps S84, S72, and S74). Since the code length X to be read from code length table 76-2 is X=1, one bit of the coded data b0 is read from code buffer memory 78-2 (steps S76, S78, and S80).

Next, the m is set at 2 in step S82 and the data reading for code buffer 62-3 starts (steps S84, S72, and S74). Since the code length X to be read this time is X=3, three bits of the coded data c0, c1, and c2 are read from code buffer memory 78-3.

Next, reading of the coded data for code buffer 62-4 starts. Since the code length X to be read is X=0, there is no coded data read from code buffer memory 78-4.

Thus, one example process cycle of data reading is completed. Therefore, in this particular process cycle of data reading code buffer 62-1, 62-2, ..., 62-4 read the data a0, b0, c0, c1, and c2 in this order, which are sent out from selector 64 as an integrated coded data stream 210. When one process cycle of data reading is completed, buffer controller 60 starts the next process cycle to read the coded data from each code buffer following the same procedures and forms an integrated coded data stream 210.

Code length table 76 and code buffer memory 78 are formed as FIFO type memories. Therefore, once data is read out from them, the next data is shifted to their right edges as shown in FIG. 22.

The flow chart shown in FIG. 21 illustrates the operations to be performed sequentially. The actual hardware, however, is configured to allow for parallel operations. More specifically, X bits of the coded data for the code length X are output in parallel, resulting in a faster operation.

Coded Data Distributor 38

Coded Data Distributor 38 of arithmetic encoder system 4 shown in FIG. 18 is described below.

As mentioned above, typical coded data streams 200-1, 200-2, ..., 200-4 have indefinite lengths. Coded data distributor 38 of the present embodiment is configured to distribute integrated coded data stream 210 according to the symmetrical or exactly reversed algorithm of that used for code integrator 36 to combine the data.

FIG. 23 illustrates the configuration of coded data distributor 38 of the present embodiment. Coded data distributor 38 comprises a coded data buffer 80 and a buffer controller 82. Coded data buffer 80 is formed to temporarily store integrated coded data 210 sent from input interface 10. Coded data buffer 80 is provided to improve the operation speed by allowing the distributor to have the capability of responding to momentary requests from four arithmetic encoders 22-1, 22-2, . . . , 22-4 for a large amount of coded data. Thus, coded data buffer 80 is not a critical component. It, however, reduces the wait time of each arithmetic encoder 22 and improves processing speed and throughput when the bus width from input interface 10 is not large enough.

Since arithmetic encoder system 2 shown in FIG. 17 produces encoded data by individual arithmetic encoder 10-1, 10-2, . . . , 10-4 and combines them into an integrated coded data stream, arithmetic decoder system 4 shown in FIG. 18 is formed so that the decoding operation is also performed by individual decoders 22-1, 22-2, . . . , 22-4 in that order.

In step S58 of the process cycle shown in FIG. 10, arithmetic encoders 22-1, 22-2, . . . , 22-4 output to buffer controller 82 code length data 212 needed for the decoding process of the next cycle together with the request signal Req in the timing shown in FIG. 11 (B).

Responding to the request signals Req from individual arithmetic encoders 22-1, 22-2, . . . , 22-4, buffer controller 82 chops integrated coded data 210, starting from the top of the data stream which is temporarily stored in coded buffer 80, into a series of small coded data having the code lengths 212-1, 212-2, . . . , 212-4 specified by the encoders 22-1, 22-2, . . . , 22-4, respectively and then distributes them to arithmetic encoders 22-1, 22-2, . . . , 22-4. Repeating this distribution operation at every processing cycle, buffer controller 82 can divide integrated coded data stream 210 into a plurality of coded data streams 200-1, 200-2, . . . , 200-4.

After sending out coded data at every processing cycle from buffer 80 to individual arithmetic decoder 22-1, 22-2, . . . , 22-4, buffer controller 82 demands input interface 10 to feed buffer 80 with data of the same length as that of the data sent out. This allows for integrated coded data 210 with the fixed number of bits to remain in buffer 80, which increases the data processing speed as mentioned above.

Thus, not only does arithmetic encoder 10 of system 2 in FIG. 17 encode and arithmetic decoder 22 of system 4 in FIG. 18 decode the symbols of the same data stream, but also encoder 10 sends out and decoder 22 receives the coded data of the same bit length. This characteristic allows integrated coded data stream 210 to be automatically reconfigured to a plurality of coded data streams 200-1, 200-2, . . . , 200-4 by following the reversed procedure of the encoding process. Therefore, arithmetic decoder system 4 does not require a special configuration for data separation and hence can have a simple structure.

FIG. 24 shows a flow chart of coded data distributor 38 of the present embodiment, and FIG. 25 shows an example of its operation.

First, coded data distributor 38 starts its operation setting both n and m at 0, n=0 and m=0 (steps S90 and S92).

Responding to the request signals from arithmetic decoders 22-1, 22-2, . . . , 22-4 in that order, coded data distributor 38 separates coded data having the requested code lengths from the top of integrated data stream 200 and distributes them to the corresponding arithmetic decoders (steps S94–S106). Repeating this cycle of operations divides integrated coded data 210 into original coded data streams 200-1, 200-2, . . . , 200-4.

In taking the first process cycle of FIG. 25, individual decoders 22-1, 22-2, . . . , 22-4 receive one bit, one bit, three bits, and zero bits of coded data, respectively. Each decoder writes received coded data in code register 50 starting at the lowest order digit and performs a series of decoding processes shown in FIG. 10. Arithmetic decoders 22-1, 22-3, and 22-4 carry out the normalization processes of 2 bits, 1 bit, and 1 bit, respectively, while arithmetic decoders 22-2 does not.

Therefore, the code length data 212 provided together with the request signal Req from arithmetic decoders 22-1, 22-2, . . . , 22-4 is 2 bits, 0 bit, 1 bit, and 1 bit, respectively.

Thus, in the second process cycle, from integrated coded data stream 210, arithmetic decoder 22-1 receives the 2-bit data of a1 and a2; arithmetic decoder 22-3, the 1-bit data of c3; and arithmetic decoder 22-4, the 1-bit data of d0. Since individual arithmetic decoder 22 performs the decoding operation following the reversed procedures of arithmetic encoder 10, the amount of the encoding operation by the arithmetic encoder to produce coded data is the same as that of the decoding operation for that coded data by the arithmetic decoder. As a result, the code length of the coded data arithmetic decoder 22 requests for the next operation equals the code length of the coded data the arithmetic encoder outputs next. Thus, as shown in FIG. 25, the distribution operation of coded data distributor 38 has the exactly reversed procedures of the encoding operation of code integrator 36 shown in FIG. 22. Thus, comparing FIG. 22 with FIG. 25, one can see that the present embodiment decomposes integrated coded data stream 210 into original coded data streams 200-1, 200-2, . . . , 200-4.

Parallel Operations of Arithmetic Encoder and Decoder

The parallel operations of arithmetic encoders 10-1, 10-2, . . . , 10-4 in FIGS. 1A or FIG. 17 and arithmetic decoders 22-1, 22-2, . . . , 22-4 in FIGS. 1B or FIG. 18 are described below.

FIG. 12A shows a timing chart for the parallel operations of arithmetic encoders 10-1, 10-2, . . . , 10-4 of system 2.

A series of processes shown in FIG. 6 are divided into four groups, processes D, S, P, and Q. This series of processes can be divided in several different ways, and the divisions other than that given here can also be used.

In the parallel operations shown in FIG. 12A, all arithmetic encoders 10-1, 10-2, . . . , 10-4 are controlled by a synchronizing controller 32 to carry out the processes D, S, P, and Q in that order and with the same phase.

An advantage of this method is that the parallel operations of arithmetic encoders 10-1, 10-2, . . . , 10-4 can be implemented with a simple control scheme, although there is the possibility of a wait for output if a large number of codes are generated in the process Q.

Next, the parallel operations of arithmetic decoders 22-1, 22-2, . . . , 22-4 shown in FIG. 12B are described below.

A series of processes shown in FIG. 10 are divided into four groups, processes D', S', P', and Q'. This series of processes can be divided in several different ways, and the divisions rather than that given here can also be used. However, the division of this series of decoding processes should be consistent with the division of encoding processes as shown in FIG. 6.

All arithmetic decoders 22-1, 22-2, . . . , 22-4 are controlled by a synchronizing controller 32 to carry out the processes D', S', P', and Q' in that order with the same phase as shown in FIG. 12B.

Again, an advantage of this method arises from the fact that the parallel operations of arithmetic decoders 22-1, 22-2, . . . , 22-4 can be implemented with a simple control scheme, although there is a possibility of a wait for input if a large number of codes are requested in the process Q'.

FIGS. 13 A–B show other examples of the parallel operations of arithmetic encoders 10-1, 10-2, . . . , 10-4 and arithmetic decoders 22-1, 22-2, . . . , 22-4.

In this embodiment, as shown in FIG. 13A, one of arithmetic encoders 10-1, 10-2, . . . , 10-4 performs a process, D, S, P, or Q and the following encoder performs the preceding process. This synchronizing control method allows for encoding without a wait, even if a large number of codes are generated in the process Q.

Similarly, as shown in FIG. 16 B, one of arithmetic decoders 22-1, 22-2, . . . , 22-4 performs a process, D', S', P', or Q', and the following decoder performs the preceding process. This synchronizing control method allows for decoding without a wait, even if a large number of codes are requested in the process Q'.

In the aforementioned embodiments, arithmetic encoder system 2, for example, comprises four arithmetic encoders 10-1, 10-2, . . . , 10-4 to process image data streams 110-1, 110-2, 110-3, and 110-4 in parallel. The present invention is not limited to that special configuration. For example, the system may have a single arithmetic encoder 10 which processes image data streams 110-1, 110-2, 110-3, and 110-4 in parallel using the pipeline process as shown in FIG. 14.

Arithmetic encoder 10 of this embodiment is different from the one shown in FIG. 5 only in that it has four delay units 40-1, 40-2, . . . , 40-4; four status registers 42-1, 42-2, . . . , 42-4; a selector 43 for selecting outputs from status registers 42; four area registers 48-1, 48-2, . . . , 48-4; four code registers 50-1, 50-2, . . . , 50-4; and a selector 54 for controlling data input and output to and from registers 48 and 50. It has a single probability estimator 44 and a single processor 46 as for other hardware resources.

Selector 43 switches status registers 42-1, 42-2, . . . , and 42-4 from one to another; and selector 54 switches area registers 48-1, 48-2, . . . , and 48-4 and code registers 50-1, 50-2, . . . , and 50-4 to perform the pipeline operations as shown in FIG. 18.

FIG. 15 shows an example of the pipeline operations of arithmetic encoder 10 in FIG. 14.

Arithmetic encoder 10 of the present embodiment is configured to perform the pipeline operation for the four image data streams provided to delay units 40-1, 40-2, . . . , 40-4. During the first machine cycle S0 data stream 110-1 is sent to delay unit 40-1 (Process D).

During the next machine cycle S1, the table value of status register 42-1 is referred to for the context CX value produced by delay unit 40-1 (Process S). At the same time data stream 110-2 is sent to delay unit 40-2 (Process D).

In the next machine cycle S2, the output from status register 42-1 is sent to probability estimator 44 through selector 43 and the table therein is referred to (process P). At the same time the table of status register 42-2 is referred to for the context value produced by delay unit 40-2 and delay unit 40-3 receives data stream 110-3 (Process D).

During the next machine cycle S3, processor 46 performs the arithmetic operation and outputs coded data. Registers 48-1, 50-1, and status register 42-1 are updated with the next values (Process Q). At the same time the table of probability estimator 44 is referred to for the output of status register 42-2 (Process P). Further, the table of status register 42-3 is referred to for the context CX produced by delay unit 40-3 (Process S). Finally, data stream 110-4 is read by delay unit 40-4 (Process D). By repeating the above processes, image data streams 100-1, 100-2, . . . , 100-4 are processed in the pipeline in sequence.

Thus, the present embodiment allows a single arithmetic encoder to process four image data streams 110-1, 110-2, . . . , 110-4 in parallel using the pipeline.

FIG. 16 illustrates arithmetic decoder 22, which performs the parallel operation using the same type of pipeline as does arithmetic encoder 10 shown in FIG. 14.

Arithmetic decoder 22 comprises four delay units 40-1, 40-2, . . . , 40-4; four status registers 42-1, 42-2, . . . , 42-4; four area registers 48-1, 48-2, . . . , 48-4; and four code registers 50-1, 50-2, . . . , 50-4. It selectively inputs and outputs data by means of selectors 43 and 54. All other hardware resources are single units, including probability estimator 44 and processor 52.

FIG. 14 also demonstrates an example of the pipeline operation of arithmetic decoder 22. Arithmetic decoder 22 of the present embodiments may process incoming coded data streams 200-1, 200-2, . . . , 200-4 using the pipeline.

That is, in the first machine cycle S0, image data stream 100-1, already decoded, is read to delay unit 40-1 (Process D'). In the initial stage a predetermined value (typically zero as in the case of the encoder) is written.

In the next machine cycle S1, the table of status register 42-1 is referred to for the context CX value produced by delay unit 40-1 (Process S'). At the same time decoded data stream 110-2 is sent to delay unit 40-2 (Process D').

In the next machine cycle S2, the table of probability estimator 44 is referred to for the output from status register 42-1 (Process P'). At the same time the table of status register 42-2 is referred to for the context value CX produced by delay unit 40-2 (Process S') and delay unit 40-3 receives data stream 100-3 (Process D').

In the machine cycle S3, processor 52 performs the arithmetic operation on coded data stream 200-1 and outputs decoded image data stream 100-1. Registers 48-1, 50-1, and status register 42-1 are updated with the next values (Process Q'). At the same time the table of probability estimator 44 is referred to for the output of status register 42-2 (Process P'). Further, the table of status register 42-3 is referred to for the context CX produced by delay unit 40-3 (Process S'). Finally, decoded image data stream 100-4 is read by delay unit 40-4 (Process D').

By repeating the above processes coded data streams 200-1, 200-2, . . . , 200-4 are decoded in the pipeline in sequence to produce image data streams 110-1, 110-2, . . . , 110-4. Thus, a single arithmetic decoder can decode four coded data streams 200-1, 200-2, . . . , 200-4 in parallel using the pipeline.

FIGS. 26 and 27 demonstrate other embodiments of code integrator 36 used in system 2 in FIG. 17 and coded data distributor 38 of system 4 in FIG. 18, respectively. Code integrator 36 and coded data distributor 38 of this embodiment are used together with the arithmetic encoder of system 2 in FIG. 14 and the arithmetic decoder of system 4 in FIG. 16.

Code integrator 36, shown in FIG. 26, distributes coded data streams 200-1, 200-2, . . . , 200-4 produced by arithmetic encoder 10 in cycle and in this order, as well as their associated data, to corresponding code buffers 62-1, 62-2, . . . , 62-4 under the control of buffer input selector 60-1. It outputs the data stored in buffers 62-1, 62-2, . . . , 62-4 to selector 64 in the prescribed order and under the control of buffer output selector 60-2, in the same way as the embodiment shown in FIG. 19 does. Then, the output data streams are combined therein to form integrated coded data stream 210.

Coded data distributor 38, shown in FIG. 27, receives code length data 212-1, 212-2, . . . , 212-4 as well as the request signals Req produced in cycle by arithmetic decoder 22 shown in FIG. 16. It divides integrated coded data stream 210 according to the code length data and outputs them to arithmetic decoder 22 in sequence to be decoded.

Therefore, code integrator 36, shown in FIG. 26, and coded data distributor 38, shown in FIG. 27, using an arithmetic encoder or an arithmetic decoder that operates with the pipeline, allow the system to create an integrated coded data stream or to divide it into coded data streams.

The aforementioned embodiments for image data arithmetic encoder system 2 comprise data distributor 30. The present invention, however, does not require data distributor 30 if memory means or transfer means 16 provides image data divided in a plurality of image data streams.

Applications of Encoder and Decoder Systems

FIGS. 28 and 29 illustrate examples of the systems to which the present invention can be applied.

The system shown in FIG. 29 includes a vending machine with a liquid crystal display 90 on its front panel to display product commercials in animation. The circuit of the system includes memory means 18 such as a ROM that stores coded data encoded by the image arithmetic encoder system 2 of the present invention. The coded data stored in ROM 18 is played back by image play back circuit 92, which includes the arithmetic decoder system of the present invention and is displayed on display 90.

Thus, the highly compressed image data stored in ROM 18 is displayed on display 90. The important issue for this type of product is the decoding speed for coded data. One can construct arithmetic encoder system 2 shown in FIG. 1A or FIG. 17 in software form using a computer, compress a large quantity of image data to a high density given a long enough time, and then write the data in ROM 18. The ROM's storing of the same data can be reproduced in large quantity and can be installed in vending machines located in various places. Arithmetic decoder system 4 shown in FIG. 1B or FIG. 18, configured in image play back circuit 92, for example, may be constructed in hardware form so that it can decode the highly compressed coded data at a high speed and display it on display 90. Accordingly, the animation can be displayed without any time lapse, and the motion becomes very smooth. Further, an image of good quality can be displayed on display 90 larger than before.

For different products, in this system, different ROM's 18 are installed in the display modules. Therefore, this system can easily adapt to various vending machines dispensing new and different products.

A system shown in FIG. 29 compresses the image data shot by a TV camera 94 by means of arithmetic encoder system 2 of the present invention and transfers the coded data through a transmission line. The transmitted image data is expanded by arithmetic decoder system 4, included in the image integration circuit, and is displayed on display 96.

The present invention results in faster encoding and decoding than conventional methods. Therefore, the present invention is suitable for real time image data transfer.

As the amount of data to be processed increases, the number of parallel processes of arithmetic encoder 10 of systems 2 and 4 may be increased. Thus, the present invention has many applications.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

TABLE 1

| ST | LSZ | NLPS | NMPS | SWITCH |
|----|------|------|------|--------|
| 0  | 0X5A1D | 1 | 1 | 1 |
| 1  | 0X2586 | 14 | 2 | 0 |
| 2  | 0X1114 | 16 | 3 | 0 |
| 3  | 0X080B | 18 | 4 | 0 |
| 4  | 0X03D8 | 20 | 5 | 0 |
| 5  | 0X01DA | 23 | 6 | 0 |
| 6  | 0X00E5 | 25 | 7 | 0 |
| 7  | 0X006F | 28 | 8 | 0 |
| 8  | 0X0036 | 30 | 9 | 0 |
| 9  | 0X001A | 33 | 10 | 0 |
| 10 | 0X000D | 35 | 11 | 0 |
| 11 | 0X0006 | 9 | 12 | 0 |
| 12 | 0X0003 | 10 | 13 | 0 |
| 13 | 0X0001 | 12 | 13 | 0 |
| 14 | 0X5A7F | 15 | 15 | 1 |
| 15 | 0X3F25 | 36 | 16 | 0 |
| 16 | 0X2EF2 | 38 | 17 | 0 |
| 17 | 0X207C | 39 | 18 | 0 |
| 18 | 0X17B9 | 40 | 19 | 0 |
| 19 | 0X1182 | 42 | 20 | 0 |
| 20 | 0X0CEF | 43 | 21 | 0 |
| 21 | 0X09A1 | 45 | 22 | 0 |
| 22 | 0X072F | 46 | 23 | 0 |
| 23 | 0X055C | 48 | 24 | 0 |
| 24 | 0X0406 | 49 | 25 | 0 |
| 25 | 0X03003 | 51 | 26 | 0 |
| 26 | 0X0240 | 52 | 27 | 0 |
| 27 | 0X01B1 | 54 | 28 | 0 |
| 28 | 0X0144 | 56 | 29 | 0 |
| 29 | 0X00F5 | 57 | 30 | 0 |
| 30 | 0X00B7 | 59 | 31 | 0 |
| 31 | 0X008A | 60 | 32 | 0 |
| 32 | 0X0068 | 62 | 33 | 00 |
| 33 | 0X004E | 63 | 34 | 0 |
| 34 | 0X003B | 32 | 35 | 0 |
| 35 | 0X002C | 33 | 9 | 0 |
| 36 | 0X5AE1 | 37 | 37 | 1 |
| 37 | 0X484C | 64 | 38 | 0 |
| 38 | 0X3A0D | 65 | 39 | 0 |
| 39 | 0X2EF1 | 67 | 40 | 0 |
| 40 | 0X261F | 68 | 41 | 0 |
| 41 | 0X1F33 | 69 | 42 | 0 |
| 42 | 0X19A8 | 70 | 43 | 0 |
| 43 | 0X1518 | 72 | 44 | 0 |
| 44 | 0X1177 | 73 | 45 | 0 |
| 45 | 0X0E74 | 74 | 46 | 0 |
| 46 | 0X0BFB | 75 | 47 | 0 |
| 47 | 0X09F8 | 77 | 48 | 0 |
| 48 | 0X0861 | 78 | 49 | 0 |
| 49 | 0X0706 | 79 | 50 | 0 |
| 50 | 0X05CD | 48 | 51 | 0 |
| 51 | 0X04DE | 50 | 52 | 0 |
| 52 | 0X040F | 50 | 53 | 0 |
| 53 | 0X0363 | 51 | 54 | 0 |
| 54 | 0X02D4 | 52 | 55 | 0 |
| 55 | 0X025C | 53 | 56 | 0 |
| 56 | 0X01F8 | 54 | 57 | 0 |

TABLE 1-continued

| ST | LSZ | NLPS | NMPS | SWITCH |
|---|---|---|---|---|
| 57 | 0X01A4 | 55 | 58 | 0 |
| 58 | 0X0160 | 56 | 59 | 0 |
| 59 | 0X0125 | 57 | 60 | 0 |
| 60 | 0X00F6 | 58 | 61 | 0 |
| 61 | 0X00CB | 59 | 62 | 0 |
| 62 | 0X00AB | 61 | 63 | 0 |
| 63 | 0X008F | 61 | 32 | 0 |
| 64 | 0X5B12 | 65 | 65 | 1 |
| 65 | 0X4D04 | 80 | 66 | 0 |
| 66 | 0X412C | 81 | 67 | 0 |
| 67 | 0X37D8 | 82 | 68 | 0 |
| 68 | 0X2FE8 | 83 | 69 | 0 |
| 69 | 0X293C | 84 | 70 | 0 |
| 70 | 0X2379 | 86 | 71 | 0 |
| 71 | 0X1EDF | 87 | 72 | 0 |
| 72 | 0X1AA9 | 87 | 73 | 0 |
| 73 | 0X174E | 72 | 74 | 0 |
| 74 | 0X1424 | 72 | 75 | 0 |
| 75 | 0X119C | 74 | 76 | 0 |
| 76 | 0X0F6B | 74 | 77 | 0 |
| 77 | 0X0D51 | 75 | 78 | 0 |
| 78 | 0X0BB6 | 77 | 79 | 0 |
| 79 | 0X0A40 | 77 | 48 | 0 |
| 80 | 0X5832 | 80 | 81 | 1 |
| 81 | 0X4D1C | 88 | 82 | 0 |
| 82 | 0X438E | 89 | 83 | 0 |
| 83 | 0X3BDD | 90 | 84 | 0 |
| 84 | 0X34EE | 91 | 85 | 0 |
| 85 | 0X2EAE | 92 | 86 | 0 |
| 86 | 0X299A | 93 | 87 | 0 |
| 87 | 0X2516 | 86 | 71 | 0 |
| 88 | 0X5570 | 88 | 89 | 1 |
| 89 | 0X4CA9 | 95 | 90 | 0 |
| 90 | 0X44D9 | 96 | 91 | 0 |
| 91 | 0X8E22 | 97 | 92 | 0 |
| 92 | 0X3824 | 99 | 93 | 0 |
| 93 | 0X32B4 | 99 | 94 | 0 |
| 94 | 0X2E17 | 93 | 86 | 0 |
| 95 | 0X56A8 | 95 | 96 | 1 |
| 96 | 0X4F46 | 101 | 97 | 0 |
| 97 | 0X47E5 | 102 | 98 | 0 |
| 98 | 0X41CF | 103 | 99 | 0 |
| 99 | 0X3C3D | 104 | 100 | 0 |
| 100 | 0X375E | 99 | 93 | 0 |
| 101 | 0X5231 | 105 | 102 | 0 |
| 102 | 0X4C0F | 106 | 103 | 0 |
| 103 | 0X4639 | 107 | 104 | 0 |
| 104 | 0X415E | 103 | 99 | 0 |
| 105 | 0X5627 | 105 | 106 | 1 |
| 106 | 0X50E7 | 108 | 107 | 0 |
| 107 | 0X4B85 | 109 | 103 | 0 |
| 108 | 0X5597 | 110 | 109 | 0 |
| 109 | 0X504F | 111 | 107 | 0 |
| 110 | 0X5A10 | 110 | 111 | 1 |
| 111 | 0X5522 | 112 | 109 | 0 |
| 112 | 0X59EB | 112 | 111 | 1 |

TABLE 2A

| row | ST | Input Data Pix | Encoding Line A (Register 48) | Minor Symbol Generation Probability LSZ | Major Symbol Generation Probability (A-LSZ) | Minor Symbol LPS | Q (Binary Notation) Code Output | C (Register 50) |
|---|---|---|---|---|---|---|---|---|
| 1 | 0 |  | 10000h | 5A1Dh | A5E3h | 1 |  | 0000h |
| 2 | 0 | 0 | 0A5E3h | 5A1Dh | 4BCBh | 1 |  | 0000h |
| 3 | 0 | 0 | 05A1Dh | 5 | 5 | 1 |  | 4BCBh |
| 4 | 1 | 1 bit shift | 0B43Ah | 2586h | 8EB4h | 1 |  | 9796h |
| 5 | 1 | 1 | 02586h | 5 | 5 | 1 | 1 | 264Ah |
| 6 | 14 | 2 bit shift | 09618h | 5A7Fh | 3B99h | 1 | 100 | 9928h |
| 7 | 14 | 1 | 03B99h | 5 | 5 | 1 | 100 | 9928h |
| 8 | 15 | 2 bit shift | 0EE64h | 3F25h | AF3Fh | 0 | 10010 | 64A0h |
| 9 | 15 | 1 | 0AF3Fh | 3F25h | 701Ah | 0 | 10010 | 64A0h |
| 10 | 15 | 1 | 0701Ah | 5 | 5 | 0 | 10010 | 64A0h |
| 11 | 16 | 1 bit shift | 0E034h | 2CFCh | B342h | 0 | 100100 | C940h |

Original Data 001111 Coded Data 100100 1100100101000000

TABLE 2B

| row | ST | Data | Encoding Line A (Register 48) | Minor Symbol Generation Probability LSZ | Major Symbol Generation Probability (A-LSZ) | Minor Symbol LPS | C(after) (Register 50) | Output Data Pix |
|---|---|---|---|---|---|---|---|---|
| 1 | 0 |  | 10000h | 5A1Dh | A5E3h | 1 | 9325h | 5 |
| 2 | 0 |  | 0A5E3h | 5A1Dh | 4BCBh | 1 | 9325h | 0 |
| 3 | 0 |  | 05A1Dh | 5 | 5 | 1 | 475Ah | 0 |
| 4 | 1 | 1 bit shift | 0B43Ah | 2586h | 8EB4h | 1 | 8EB4h | 5 |
| 5 | 1 |  | 02586h | 5 | 5 | 1 | 0000h | 1 |
| 6 | 14 | 2 bit shift | 09618h | 5A7Fh | 3B99h | 1 | 0000h | 5 |
| 7 | 14 |  | 03B99h | 5 | 5 | 1 | 0000h | 1 |
| 8 | 15 | 2 bit shift | 0EE64h | 3F25h | AF3Fh | 0 | 0000h | 5 |
| 9 | 15 |  | 0AF3Fh | 3F25h | 701Ah | 0 | 0000h | 1 |
| 10 | 15 |  | 0701Ah | 5 | 5 | 0 | 0000h | 1 |
| 11 | 16 | 1 bit shift | 0E034h | 2CFCh | B342h | 0 | 0000h | 5 |

Coded Data 100100 1100100101000000 Decoded Data 001111

What is claimed is:

1. An image data encoder system comprising:
a data division circuit to divide image data at least partially representing an image into a plurality of individual image data streams according to at least one of a format of the image data and a spatial relationship between the image data and the image;
a plurality of dedicated arithmetic encoders in communication with said data division circuit to encode the individual data streams in parallel as a corresponding plurality of coded data streams, each of said dedicated arithmetic encoders corresponding to and encoding one of the individual data streams into one of the coded data streams; and
a data integrator in communication with said arithmetic encoders to combine the coded data streams in accordance with prescribed rules to form a single integrated coded data stream;
wherein said data integrator means comprises:
a plurality of buffers in communication with said arithmetic encoders to temporarily store the coded data streams in sequence and perform carry transfer operations based on carry signals issued by said arithmetic encoder;
a code combining circuit in communication with said plurality of buffers to receive buffered coded data streams issued therefrom and sequentially combine the received coded data streams into a single, integrated coded data stream; and
a buffer controller in communication with said plurality of buffers and said code combining circuit to determine a probability of carry transfer based on the carry transfer operations performed by said plurality of buffers and to control transmission of the coded data streams stored in said plurality of buffers to said code combining circuit according to a predetermined order when the determined probability of carry transfer is low.

2. The image data encoder system of claim 1, wherein each said data integrator buffer is coupled to a selected one of said arithmetic encoders and comprises:
a first-in-first-out buffer memory in communication with said selected arithmetic encoder, said buffer controller, and said code combining circuit to sequentially store at least one of the coded data streams emanating from said arithmetic encoder;
a first-in-first-out code length memory in communication with said selected arithmetic encoder, said buffer controller, and said code combining circuit to sequentially store a corresponding code length for each coded data stream stored by said buffer memory; and
a carry transfer processor in communication with said selected arithmetic encoder and said buffer controller to perform carry transfer operations for the coded data stored in said buffer memory responsive to a corresponding carry signal issued by said selected arithmetic encoder; and
wherein, for each buffer, said buffer controller controls transmission of the coded data streams stored in the buffer memory and the corresponding code lengths stored in the code length memory to said code combining circuit according to the predetermined order.

3. The image data encoder system of claims 1 or 2, further comprising storage means in communication with said data integrator for storing the integrated coded data stream.

4. The image data encoder system of claim 1, wherein said plurality of dedicated arithmetic encoders encodes the individual image data streams concurrently.

5. The image data encoder system of claim 1, wherein said plurality of dedicated arithmetic encoders encodes said individual image data streams using pipelined parallel processing.

6. The image data encoder system of claim 1, further comprising a data integrator in communication with said arithmetic encoders to combine the coded data streams in accordance with prescribed rules to form a single, integrated coded data stream.

7. The image data encoder system of claim 1, further comprising a synchronizing controller in communication with each said dedicated arithmetic decoder for selectively sequencing encoding of each individual data stream.

8. An image data encoder system, comprising:
a data division circuit to divide image data at least partially representing an image into a plurality of individual image data streams according to at least one of a format of the image data and a spatial relationship between the image data and the image; and
a plurality of dedicated arithmetic encoders in communication with said data division circuit to encode the individual data streams in parallel as a corresponding plurality of coded data streams, each of said dedicated arithmetic encoders corresponding to and encoding one of the individual data streams into one of the coded data streams;
wherein each of said dedicated arithmetic encoders comprises:
context generating means in communication with said data distributor for generating reference pixel data from pixel data contained in the corresponding individual image data stream as a context signal;
index generating means in communication with said context generating means for producing an optimum transition destination index $ST_i$ as a function of the context signal and a transition destination index $ST_0$;
probability estimator means in communication with said index generating means for composing table data corresponding to the optimum transition destination index $ST_i$, the table data being stored therein and including, for each table index ST, a symbol generating probability for at least one of the group consisting of major and minor symbols, a transition destination index NLPS when the minor symbol is generated, and a transition destination index NMPS when a major symbol is generated;
area register means for storing length data A of a new encoding line created every time pixel data is received;
code register means for storing a coordinate of the point included in the new encoding line created for each pixel data, as position coordinate data C; and
processing means in communication with said index generating means, probability estimator means, said area register means, and said code register means, for each pixel data received by said context generating means:
dividing the encoding line length A and position coordinate data C stored in the area and code registers, respectively, according to symbol generating probability for given pixel data included in the table data of said probability estimator means, in order to create a next new encoding line;
updating the encoding line length A and position coordinate data C stored in the area and code registers, respectively, according to the next new encoding line; and transmitting to said index generating means one of the input transition destination index NLPS when the given pixel data is a minor symbol and transition destination index NMPS when the given pixel data is a major symbol as the next transition destination index ST0.

9. The image data encoder system of claim 8, wherein said processing means:

normalizes the length data A of the encoding line stored in the code register means relative to a predetermined standard value through bit shifting operations; and outputs overflowing data from the code register as coded data included in the corresponding coded data stream.

10. An image data encoder/decoder system, comprising:

a data division circuit to divide original image data at least partially representing an image into a plurality of individual image data streams according to at least one of a format of the image data and a spatial relationship between the image data and the image;

a plurality of dedicated arithmetic encoders in communication with said first data division circuit to encode the individual data streams in parallel as a corresponding plurality of coded data streams, each of said dedicated arithmetic encoders corresponding to and encoding one of the individual data streams into one of the coded data streams;

a plurality of dedicated arithmetic decoders in communication with said arithmetic encoders, each of said dedicated arithmetic decoders in communication with one of said dedicated arithmetic encoders and decoding a corresponding one of the coded data streams as a decoded data stream; and a data integrator in communication with said plurality of dedicated arithmetic decoders to combine the decoded data streams and reform the original image data;

wherein each of said dedicated arithmetic decoders comprises:

context generating means in communication with said data encoder for generating reference pixel data for an immediately succeeding code data contained within the corresponding coded data stream based on existing decoded data stream as a context signal;

index generating means in communication with said context generating means for producing an optimum transition destination index $ST_i$ as a function of the context signal and a transition destination index $ST_0$;

probability estimator means in communication with said index generating means for table data corresponding to the optimum transition destination index $ST_i$, the table data being stored therein and including, for each table index ST, a symbol generating probability for at least one of the group consisting of major and minor symbols, a transition destination index NLPS when the minor symbol is generated, and a transition destination index NMPS when a major symbol is generated;

area register means for storing length data A of a decoding line;

code register means for storing a coordinate of the point included in the new decoding line as position coordinate data C; and processing means in communication with said index generating means, probability estimator means, said area register means, and said code register means, for each pixel data received by said context generating means:

for dividing the decoding line specified with the data stored in the area register into major and minor areas according to a symbol generating probability for the pixel data included in the table data of said probability estimator means;

for defining a new decoding line depending on which area a given code data falls in;

for replacing the data stored in said area register with the new length data A;

for outputting the symbol used for selecting said divided area as the decoded pixel data corresponding to the given code data; and transmitting to said index generating means one of the input transition destination index NLPS when the decoded pixel data is a minor symbol and transition destination index NMPS when the decoded pixel data is a major symbol as the next transition destination index ST0.

11. The image data encoder/decoder system of claim 10, wherein said plurality of dedicated arithmetic decoders decodes the coded data streams concurrently.

12. The image data encoder/decoder system of claim 10, wherein said plurality of dedicated arithmetic decoders decodes said coded data streams using pipelined parallel processing.

13. The image data encoder system of claim 10, wherein said processing means:

normalizes the length data A of the decoding line stored in the code register means relative to a predetermined standard value through bit shifting operations; and outputs overflowing data from the code register as the code length of the next immediately succeeding code data of the corresponding coded data stream.

14. The image data encoder/decoder system of claim 10, further comprising a synchronizing controller in communication with each said dedicated arithmetic decoder for selectively sequencing decoding of each coded data stream.

* * * * *

UNITED STATES PATENT AND TRADEMARK OFFICE
CERTIFICATE OF CORRECTION

PATENT NO. : 5,809,176
DATED : September 22, 1998
INVENTOR(S) : Akihiko Yajima

It is certified that an error appears in the above identified patent and that said Letters Patent is hereby corrected as shown below:

Column 35, line 48, insert --composing-- before "table data".

Signed and Sealed this

Thirteenth Day of June, 2000

Attest:

Q. TODD DICKINSON

*Attesting Officer*   *Director of Patents and Trademarks*